(12) United States Patent
Wang et al.

(10) Patent No.: US 11,782,562 B2
(45) Date of Patent: Oct. 10, 2023

(54) TOUCH PANEL, TOUCH DISPLAY PANEL, AND ELECTRONIC DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Mingqiang Wang, Beijing (CN); Hongjin Hu, Beijing (CN); Lixiang Yi, Beijing (CN); Junhui Yang, Beijing (CN); Zhenhua Zhang, Beijing (CN); Xin Bi, Beijing (CN); Bin Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 197 days.

(21) Appl. No.: 17/310,375

(22) PCT Filed: Sep. 17, 2020

(86) PCT No.: PCT/CN2020/115956
§ 371 (c)(1),
(2) Date: Jul. 29, 2021

(87) PCT Pub. No.: WO2022/056783
PCT Pub. Date: Mar. 24, 2022

(65) Prior Publication Data
US 2022/0317812 A1    Oct. 6, 2022

(51) Int. Cl.
*G06F 3/044* (2006.01)
*G06F 3/041* (2006.01)
(Continued)

(52) U.S. Cl.
CPC .......... *G06F 3/0446* (2019.05); *G06F 3/0412* (2013.01); *G06F 3/0445* (2019.05);
(Continued)

(58) Field of Classification Search
CPC .... G06F 3/0446; G06F 3/0445; G06F 3/0412; G09F 9/30
(Continued)

(56) References Cited

U.S. PATENT DOCUMENTS

| 2014/0346027 | A1* | 11/2014 | Li | G06F 3/0443 |
|---|---|---|---|---|
| | | | | 200/600 |
| 2016/0162084 | A1* | 6/2016 | Wang | G06F 3/0446 |
| | | | | 345/173 |

(Continued)

*Primary Examiner* — Prabodh M Dharia
(74) *Attorney, Agent, or Firm* — Kinney & Lange, P.A.

(57) ABSTRACT

A touch panel includes first touch electrodes and second touch electrodes. At least one first touch electrode includes first sub-electrodes electrically connected to one another and first connecting sub-portions located between and electrically connecting every two adjacent first sub-electrodes. At least one second touch electrode includes second sub-electrodes electrically connected to one another and second connecting sub-portions located between and electrically connecting every two adjacent second sub-electrodes. At least one first connecting sub-portion at least partially overlaps at least one second connecting sub-portion so as to form a stacked structure as a connecting portion. The touch panel includes an opening area, and the connecting portions include at least one adjacent connecting portion adjacent to the opening area, where a center of an orthographic projection of the adjacent connecting portion does not overlap a first intersection point and is located outside the opening area.

20 Claims, 21 Drawing Sheets

(51) Int. Cl.
 *G09F 9/30* (2006.01)
 *H10K 59/00* (2023.01)
(52) U.S. Cl.
 CPC .............. *G06F 3/0448* (2019.05); *G09F 9/30* (2013.01); *H10K 59/00* (2023.02)
(58) Field of Classification Search
 USPC .......................................... 345/173; 200/600
 See application file for complete search history.

(56) References Cited

U.S. PATENT DOCUMENTS

2017/0255287 A1* 9/2017 Huang .................. G06F 3/0445
2018/0039358 A1* 2/2018 Xie ........................ G06F 3/0448
2021/0367000 A1* 11/2021 Kim ...................... G06F 3/0412

* cited by examiner

TOUCH PANEL, TOUCH DISPLAY PANEL, AND ELECTRONIC DEVICE

CROSS-REFERENCE TO RELATED APPLICATION

This application is a Section 371 National Stage Application of International Application No. PCT/CN2020/115956, filed on Sep. 17, 2020, entitled "TOUCH PANEL, TOUCH DISPLAY PANEL, AND ELECTRONIC DEVICE", which is incorporated herein by reference in its entirety.

TECHNICAL FIELD

The present disclosure relates to a field of touch control technology, and in particular to a touch panel, a touch display panel, and an electronic device.

BACKGROUND

With user's continuous pursuit of a full-screen mobile phone, a mobile phone screen is required to have a larger touch display area and a narrower frame. At present, in a design of the mobile phone screen, an opening is provided in the touch display area to place components such as cameras. The mobile phone screen generally includes a display panel and a touch panel stacked so as to achieve a function of touch display. The opening usually needs to penetrate the display panel and the touch panel, and touch electrodes in the touch panel in proximity to the opening need to be designed in a specific manner to ensure a normal touch function.

SUMMARY

The present disclosure provides a touch panel, including: a substrate; a plurality of first touch electrodes arranged on the substrate and extending in a first direction, wherein at least one first touch electrode includes a plurality of first sub-electrodes electrically connected to one another and a plurality of first connecting sub-portions located between and electrically connecting every two adjacent first sub-electrodes; and a plurality of second touch electrodes arranged on the substrate and extending in a second direction intersecting the first direction, wherein at least one second touch electrode includes a plurality of second sub-electrodes electrically connected to one another and a plurality of second connecting sub-portions located between and electrically connecting every two adjacent second sub-electrodes, wherein at least one first connecting sub-portion at least partially overlaps at least one second connecting sub-portion so as to form a stacked structure as a connecting portion, the touch panel includes a plurality of connecting portions, and the first touch electrode and the second touch electrode are electrically insulated from one another; the touch panel includes an opening area, the plurality of connecting portions include at least one adjacent connecting portion adjacent to the opening area, and the adjacent connecting portion includes a first adjacent connecting sub-portion and a second adjacent connecting sub-portion; the first adjacent connecting sub-portion electrically connects a first adjacent sub-electrode adjacent to the opening area and a first sub-electrode adjacent to the first adjacent sub-electrode; the second adjacent connecting sub-portion electrically connects a second adjacent sub-electrode adjacent to the opening area and a second sub-electrode adjacent to the second adjacent sub-electrode; at least one first touch electrode includes the first adjacent connecting sub-portion and some other first connecting sub-portions; at least one second touch electrode includes the second adjacent connecting sub-portion and a plurality of other second connecting sub-portions; in the at least one first touch electrode, a first straight line connecting centers of orthographic projections of at least two connecting portions of a plurality of connecting portions formed by the some other first connecting sub-portions on the substrate extends in the first direction; in the at least one second touch electrode, a second straight line connecting centers of orthographic projections of at least two connecting portions of the plurality of connecting portions formed by the some other second connecting sub-portions on the substrate extends in the second direction; the first straight line and the second straight line intersect at a first intersection point, and a center of an orthographic projection of the adjacent connecting portion on the substrate does not overlap the first intersection point and is located outside the opening area.

In some embodiments, the connecting portion includes a first connecting portion, a second connecting portion, a third connecting portion and a fourth connecting portion, at least one of the first connecting portion, the second connecting portion, the third connecting portion and the fourth connecting portion is the adjacent connecting portion, the opening area is surrounded by the first connecting portion, the second connecting portion, the third connecting portion and the fourth connecting portion; the first connecting portion and the second connecting portion are adjacent to one another in the first direction and are electrically connected to a same first sub-electrode, the third connecting portion and the fourth connecting portion are adjacent to one another in the first direction and are electrically connected to a same first sub-electrode, the first connecting portion and the third connecting portion are adjacent to one another in the second direction and are electrically connected to a same second sub-electrode, and the second connecting portion and the fourth connecting portion are adjacent to one another in the second direction and are electrically connected to a same second sub-electrode.

In some embodiments, the first intersection point includes a first connecting portion intersection point corresponding to the first connecting portion, a second connecting portion intersection point corresponding to the second connecting portion, a third connecting portion intersection point corresponding to the third connecting portion, and a fourth connecting portion intersection point corresponding to the fourth connecting portion; a center of an orthographic projection of the first connecting portion on the substrate overlaps the first connecting portion intersection point, a center of an orthographic projection of the second connecting portion on the substrate does not overlap the second connecting portion intersection point, a center of an orthographic projection of the third connecting portion on the substrate overlaps the third connecting portion intersection point, and a center of an orthographic projection of the fourth connecting portion on the substrate overlaps the fourth connecting portion intersection point.

In some embodiments, at least two of a distance from the center of the opening area to the center of the orthographic projection of the first connecting portion on the substrate, a distance from the center of the opening area to the center of the orthographic projection of the second connecting portion on the substrate, a distance from the center of the opening area to the center of the orthographic projection of the third connecting portion on the substrate and a distance from the center of the opening area to the center of the orthographic projection of the fourth connecting portion on the substrate are different from one another.

In some embodiments, at least one connecting portion of the first connecting portion, the second connecting portion, the third connecting portion and the fourth connecting portion is located between and electrically connected to a $1^{st}$ first sub-electrode and a $2^{nd}$ first sub-electrode that are adjacent in the first direction, the $1^{st}$ first sub-electrode is closer to the opening area than the $2^{nd}$ first sub-electrode; the touch panel further includes a 3rd first sub-electrode on a side of the $2^{nd}$ first sub-electrode away from the $1^{st}$ first sub-electrode, the 3rd first sub-electrode is adjacent to and electrically connected to the $2^{nd}$ first sub-electrode through a fifth connecting portion; the at least one connecting portion is located between and electrically connected to a $1^{st}$ second sub-electrode and a $2^{nd}$ second sub-electrode that are adjacent in the second direction, the second sub-electrode is closer to the opening area than the $2^{nd}$ second sub-electrode; the touch panel further includes a 3rd second sub-electrode on a side of the $2^{nd}$ second sub-electrode away from the $1^{st}$ second sub-electrode, the 3rd second sub-electrode is adjacent to and electrically connected to the $2^{nd}$ second sub-electrode through a sixth connecting portion.

In some embodiments, the $1^{st}$ first sub-electrode has an area not less than 50% of an area of the 3rd first sub-electrode, and the $2^{nd}$ first sub-electrode has an area not less than 70% of the area of the 3rd first sub-electrode.

In some embodiments, the $1^{st}$ second sub-electrode has an area not less than 50% of an area of the 3rd second sub-electrode, and the $2^{nd}$ second sub-electrode has an area not less than 70% of the area of the 3rd second sub-electrode.

In some embodiments, the touch panel further includes: an effective touch area surrounding the opening area, wherein the $1^{st}$ first sub-electrode and the $1^{st}$ second sub-electrode are located in the effective touch area; and a wiring area located between the effective touch area and the opening area, wherein an anti-cracking ring is provided in the wiring area, the anti-cracking ring surrounds the opening area and is formed as a ring with at least one first opening, and the anti-cracking ring is disconnected at the at least one first opening.

In some embodiments, an anti-static ring is further provided in the wiring area, the anti-static ring surrounds the anti-cracking ring and is formed as a ring with at least one second opening corresponding to the at least one first opening, and the anti-static ring is disconnected at the at least one second opening.

In some embodiments, the second opening is a Z-shaped opening.

In some embodiments, a connecting ring is provided at a boundary between the wiring area and the effective touch area, the connecting ring surrounds the anti-static ring; the connecting ring includes a first connecting sub-ring and a second connecting sub-ring that are disconnected at a boundary of the $1^{st}$ first sub-electrode and the $1^{st}$ second sub-electrode, the first connecting sub-ring is electrically connected to the $1^{st}$ first sub-electrode, and the second connecting sub-ring is electrically connected to the $1^{st}$ second sub-electrode.

In some embodiments, the first connecting sub-ring is located on a side of the $1^{st}$ first sub-electrode away from the substrate and is in direct electrical contact with the $1^{st}$ first sub-electrode, and an orthographic projection of the first connecting sub-ring on the substrate falls within an orthographic projection of the $1^{st}$ first sub-electrode on the substrate.

In some embodiments, the second connecting sub-ring is located on a side of the $1^{st}$ second sub-electrode away from the substrate and is in direct electrical contact with the $2^{nd}$ first sub-electrode, and an orthographic projection of the second connecting sub-ring on the substrate falls within an orthographic projection of the $1^{st}$ second sub-electrode on the substrate.

In some embodiments, at least one of the anti-cracking ring and the anti-static ring includes a first sub-layer and a second sub-layer arranged sequentially away from the substrate, the first sub-layer is arranged in the same layer as the $1^{st}$ first sub-electrode and the $1^{st}$ second sub-electrode, and the second sub-layer is arranged in the same layer as the connecting ring.

In some embodiments, the touch panel further includes a curved edge and at least one first sub-electrode or second sub-electrode adjacent to the curved edge; the plurality of connecting portions further include a seventh connecting portion electrically connected to the at least one first sub-electrode or second sub-electrode adjacent to the curved edge; a fifth straight line connecting centers of orthographic projections of at least two of some other connecting portions of the first touch electrode where the seventh connecting portion is located on the substrate extends in the first direction, a sixth straight line connecting centers of orthographic projections of at least two of some other connecting portions of the second touch electrode where the seventh connecting portion is located on the substrate extends in the second direction; the fifth straight line and the sixth straight line intersect at a third intersection point, and a center of an orthographic projection of the seventh connecting portion on the substrate is located on a side of the third intersection point away from the curved edge.

In some embodiments, at least one connecting portion includes: a first connecting sub-portion extending in the first direction and electrically connecting the $1^{st}$ first sub-electrode and the $2^{nd}$ first sub-electrode that are adjacent in the first direction; and a second connecting sub-portion extending in the second direction and electrically connecting the $1^{st}$ second sub-electrode and the $2^{nd}$ second sub-electrode that are adjacent in the second direction.

In some embodiments, one of the first connecting sub-portion and the second connecting sub-portion as well as the $1^{st}$ first sub-electrode, the $2^{nd}$ first sub-electrode, the second sub-electrode and the $2^{nd}$ second sub-electrode are located in a first electrode layer; the other of the first connecting sub-portion and the second connecting sub-portion is located in a second electrode layer; a first insulating layer is provided between the first electrode layer and the second electrode layer.

In some embodiments, a structure of the first connecting sub-portion located in the second electrode layer is electrically connected to the $1^{st}$ first sub-electrode and the $2^{nd}$ first sub-electrode through a via hole penetrating the first insulating layer; a structure of the second connecting sub-portion located in the second electrode layer is in direct contact with the $1^{st}$ second sub-electrode and the $2^{nd}$ second sub-electrode.

In some embodiments, a structure of the first connecting sub-portion located in the second electrode layer is in direct contact with the $1^{st}$ first sub-electrode and the $2^{nd}$ first sub-electrode; a structure of the second connecting sub-portion located in the second electrode layer is electrically connected to the $1^{st}$ second sub-electrode and the $2^{nd}$ second sub-electrode through a via hole penetrating the first insulating layer.

In some embodiments, the touch panel further includes a second insulating layer arranged on a side of the second electrode layer away from the substrate.

In some embodiments, the first connecting sub-portion includes: an intermediate connecting electrode surrounded by the $1^{st}$ first sub-electrode, the $2^{nd}$ first sub-electrode, the $1^{st}$ second sub-electrode and the $2^{nd}$ second sub-electrode; a first bridge electrode for electrically connecting the $1^{st}$ first sub-electrode and the intermediate connecting electrode; and a second bridge electrode for electrically connecting the $2^{nd}$ first sub-electrode and the intermediate connecting electrode, the second connecting sub-portion includes: an annular connecting electrode surrounding the intermediate connecting electrode and surrounded by the $1^{st}$ first sub-electrode, the $2^{nd}$ first sub-electrode, the $1^{st}$ second sub-electrode and the $2^{nd}$ second sub-electrode; a third bridge electrode for electrically connecting the $1^{st}$ second sub-electrode and the annular connecting electrode; and a fourth bridge electrode for electrically connecting the $2^{nd}$ second sub-electrode and the annular connecting electrode.

In some embodiments, the intermediate connecting electrode, the annular connecting electrode, the $1^{st}$ first sub-electrode, the $2^{nd}$ first sub-electrode, the $1^{st}$ second sub-electrode and the $2^{nd}$ second sub-electrode are made of the same material and arranged in the same layer; the first bridge electrode, the second bridge electrode, the third bridge electrode and the fourth bridge electrode are made of the same material and arranged in the same layer.

In some embodiments, the first bridge electrode includes a $1^{st}$ first bridge electrode and a $2^{nd}$ first bridge electrode that converge from the $1^{st}$ first sub-electrode toward the intermediate connecting electrode; the second bridge electrode includes a $1^{st}$ second bridge electrode and a $2^{nd}$ second bridge electrode that converge from the $2^{nd}$ first sub-electrode toward the intermediate connecting electrode; the third bridge electrode includes a $1^{st}$ third bridge electrode and a $2^{nd}$ third bridge electrode that converge from the $1^{st}$ second sub-electrode toward the intermediate connecting electrode; the fourth bridge electrode includes a $1^{st}$ fourth bridge electrode and a $2^{nd}$ fourth bridge electrode that converge from the $2^{nd}$ second sub-electrode toward the intermediate connecting electrode.

In some embodiments, an edge of the intermediate connecting electrode includes a first polygonal line segment, a second polygonal line segment, a third polygonal line segment, a fourth polygonal line segment, a fifth polygonal line segment, a sixth polygonal line segment, a seventh polygonal line segment and an eighth polygonal line segment that are connected end to end in sequence; the first polygonal line segment and the fifth polygonal line segment extend in a fifth direction, the second polygonal line segment and the sixth polygonal line segment extend in a sixth direction, the third polygonal line segment and the seventh polygonal line segment extend in a seventh direction, and the fourth polygonal line segment and the eighth polygonal line segment extend in an eighth direction; each of the fifth direction, the sixth direction, the seventh direction and the eighth direction intersects each of the first direction and the second direction, and any two of the fifth direction, the sixth direction, the seventh direction and the eighth direction intersect one another.

In some embodiments, an edge of the annular connecting electrode away from the intermediate connecting electrode includes a first polygonal line portion, a second polygonal line portion, a third polygonal line portion, a fourth polygonal line portion, a fifth polygonal line portion, a sixth polygonal line portion, a seventh polygonal line portion and an eighth polygonal line portion that are connected end to end in sequence; the first polygonal line portion, the second polygonal line portion, the third polygonal line portion, the fourth polygonal line portion, the fifth polygonal line portion, the sixth polygonal line portion, the seventh polygonal line portion and the eighth polygonal line portion of the annular connecting electrode are arranged parallel to the first polygonal line segment, the second polygonal line segment, the third polygonal line segment, the fourth polygonal line segment, the fifth polygonal line segment, the sixth polygonal line segment, the seventh polygonal line segment and the eighth polygonal line segment of the intermediate connecting electrode, respectively.

In some embodiments, the $1^{st}$ first bridge electrode extends across the first polygonal line segment and the first polygonal line portion to electrically connect the $1^{st}$ first sub-electrode and the intermediate connecting electrode; the $2^{nd}$ first bridge electrode extends across the second polygonal line segment and the second polygonal line portion to electrically connect the $1^{st}$ first sub-electrode and the intermediate connecting electrode; the $1^{st}$ second bridge electrode extends across the sixth polygonal line segment and the sixth polygonal line portion to electrically connect the $2^{nd}$ first sub-electrode and the intermediate connecting electrode; the $2^{nd}$ second bridge electrode extends across the fifth polygonal line segment and the fifth polygonal line portion to electrically connect the $2^{nd}$ first sub-electrode and the intermediate connecting electrode; the third bridge electrode extends across the eighth polygonal line portion to electrically connect the second sub-electrode and the annular connecting electrode; the $2^{nd}$ third bridge electrode extends across the seventh polygonal line portion to electrically connect the $1^{st}$ second sub-electrode and the annular connecting electrode; the $1^{st}$ fourth bridge electrode extends across the third polygonal line portion to electrically connect the $2^{nd}$ second sub-electrode and the annular connecting electrode; and the $2^{nd}$ fourth bridge electrode extends across the fourth polygonal line portion to electrically connect the $2^{nd}$ second sub-electrode and the annular connecting electrode.

In some embodiments, at least one first sub-electrode adjacent to and electrically connected to at least one connecting portion is arranged adjacent to at least one second sub-electrode adjacent to and electrically connected to the at least one connecting portion, and a boundary between the first sub-electrode and the second sub-electrode is formed as a polygonal line.

In some embodiments, one of the first touch electrode and the second touch electrode is a touch driving electrode, and the other of the first touch electrode and the second touch electrodes is a touch sensing electrode.

Some embodiments of the present disclosure provide a touch display panel, including: a display panel; and the touch panel described in the above embodiments.

Some embodiments of the present disclosure provide an electronic device, including the touch display panel described in the above embodiments.

BRIEF DESCRIPTION OF THE DRAWINGS

By reading the detailed description of the non-limiting embodiments with reference to the following drawings, other features, objectives and advantages of the present disclosure will become more apparent.

DETAILED DESCRIPTION OF EMBODIMENTS

Figure 1:
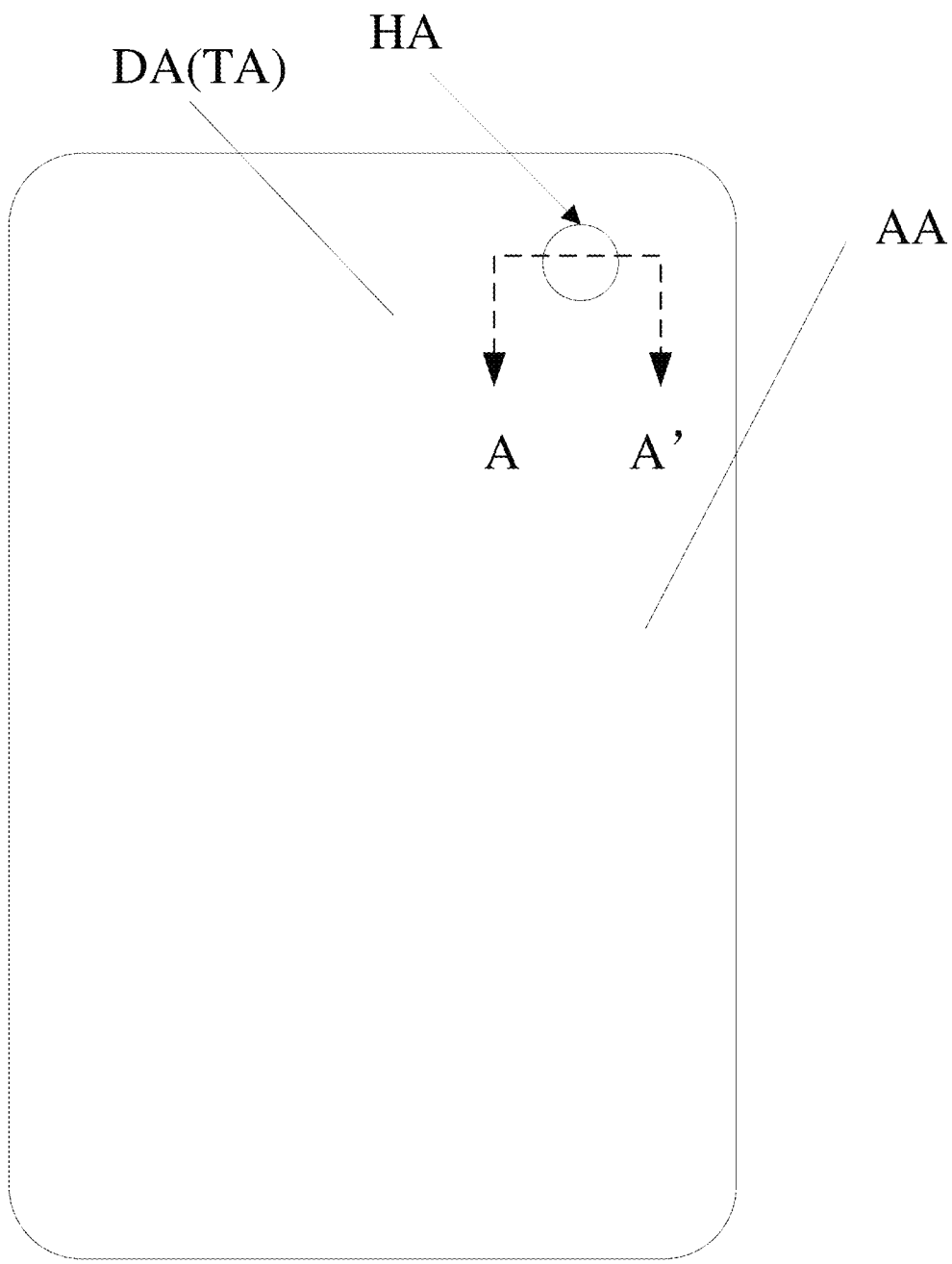
FIG. 1 shows a schematic diagram of a planar structure of a touch display panel according to some embodiments of the present disclosure.

The present disclosure will be further described in detail below with reference to the drawings and embodiments. It may be understood that the specific embodiments described here are only used to explain the related invention, but not to limit the present disclosure. In addition, it should be noted that, for ease of description, only the parts related to the present disclosure are shown in the drawings.

It should be noted that, in a case of no conflict, the embodiments in the present disclosure and the features in the embodiments may be combined with one another.

In addition, in the following detailed description, for the convenience of explanation, many specific details are set forth to provide a comprehensive understanding of the embodiments of the present disclosure. Obviously, however, one or more embodiments may also be implemented without these specific details.

It should be understood that, although terms "first," "second" and so on may be used herein to describe different elements, these elements should not be limited by these terms. These terms are only used to distinguish one element from another. For example, without departing from the scope of the exemplary embodiments, a first element may be named as a second element, and similarly, the second element may be named as the first element. A term "and/or" as used here includes any and all combinations of one or more related listed items.

It should be understood that when an element or layer is referred to as being "formed on" another element or layer, the element or layer may be directly or indirectly formed on the other element or layer. That is, for example, an intermediate element or an intermediate layer may be present. In contrast, when an element or layer is referred to as being "directly formed on" another element or layer, no intermediate elements or layers are present. Other terms used to describe a relationship between elements or layers (for example, "between" and "directly between", "adjacent to" and "directly adjacent to", etc.) should be interpreted in a similar manner.

The terms used herein are only for the purpose of describing specific embodiments, and are not intended to limit the embodiments. As used herein, unless otherwise specified in the context, a singular form is also intended to include a plural form. It should also be understood that when terms "comprising" and/or "including" are used herein, it means that the described features, wholes, steps, operations, elements and/or components are present, but do not exclude the presence or addition of one or more other features, wholes, steps, operations, elements, components and/or combinations thereof.

In the present disclosure, unless otherwise specified, expressions "located in the same layer" and "arranged in the same layer" generally mean that a first component and a second component may be formed of the same material and may be formed by the same patterning process. Expressions "located in different layers" and "arranged in different layers" generally indicate that the first component and the second component are formed by different patterning processes.

The present disclosure provides a touch panel, including a substrate, a plurality of first touch electrodes arranged on the substrate and extending in a first direction, and a plurality of second touch electrodes arranged on the substrate and extending in a second direction intersecting the first direction. At least one first touch electrode includes a plurality of first sub-electrodes electrically connected to one another and a plurality of first connecting sub-portions located between and electrically connecting every two adjacent first sub-electrodes. At least one second touch electrode includes a plurality of second sub-electrodes electrically connected to one another and a plurality of second connecting sub-portions located between and electrically connecting every two adjacent second sub-electrodes. At least one first connecting sub-portion at least partially overlaps at least one second connecting sub-portion so as to form a stacked structure as a connecting portion. The touch panel includes a plurality of connecting portions. The first touch electrode and the second touch electrode are electrically insulated from one another. The touch panel includes an opening area. The plurality of connecting portions include at least one adjacent connecting portion adjacent to the opening area, and the adjacent connecting portion includes a first adjacent connecting sub-portion and a second adjacent connecting sub-portion. The first adjacent connecting sub-portion is electrically connected to a first adjacent sub-electrode adjacent to the opening area and a first sub-electrode adjacent to the first adjacent sub-electrode. The second adjacent connecting sub-portion electrically connects a second adjacent sub-electrode adjacent to the opening area and a second sub-electrode adjacent to the second adjacent sub-electrode. At least one first touch electrode includes the first adjacent connecting sub-portion and some other first connecting sub-portions. At least one second touch electrode includes the second adjacent connecting sub-portion and some other second connecting sub-portions. In the at least one first touch electrode, a first straight line connecting centers of orthographic projections of at least two connecting portions of a plurality of connecting portions formed by the some other first connecting sub-portions on the substrate extends in the first direction. In the at least one second touch electrode, a second straight line connecting centers of orthographic projections of at least two connecting portions of the plurality of connecting portions formed by the some other second connecting sub-portions on the substrate extends in the second direction. The first straight line and the second straight line intersect at a first intersection point. A center of an orthographic projection of the adjacent connecting portion on the substrate does not overlap the first intersection point and is located outside the opening area.

In some embodiments, a ratio of a distance between the center of the orthographic projection of the adjacent connecting portion on the substrate and a center of the opening area to a distance between the first intersection point and the center of the opening area is greater than 1. In some embodiments, a ratio of the distance between the center of the orthographic projection of the adjacent connecting portion on the substrate and the center of the opening area to the distance between the first intersection point and the center of the opening area is greater than 1.09. In some embodiments, the ratio of the distance between the center of the orthographic projection of the adjacent connecting portion on the substrate and the center of the opening area to the distance between the first intersection point and the center of the opening area is greater than 1.2. In some embodiments, the ratio of the distance between the center of the orthographic projection of the adjacent connecting portion on the substrate and the center of the opening area to the distance between the first intersection point and the center of the opening area is greater than 1.3. In some embodiments, the ratio of the distance between the center of the orthographic projection of the adjacent connecting portion on the substrate and the center of the opening area to the distance between the first intersection point and the center of the opening area is greater than 1.4. In some embodiments, the ratio of the distance between the center of the orthographic projection of the adjacent connecting portion on the substrate and the center of the opening area to the distance between the first intersection point and the center of the opening area is greater than 1.5. In some embodiments, the ratio of the distance between the center of the orthographic projection of the adjacent connecting portion on the substrate and the center of the opening area to the distance between the first intersection point and the center of the opening area is greater than 1.6. In some embodiments, the ratio of the distance between the center of the orthographic projection of the adjacent connecting portion on the substrate and the center of the opening area to the distance between the first intersection point and the center of the opening area is greater than 1.7. In some embodiments, the ratio of the distance between the center of the orthographic projection of the adjacent connecting portion on the substrate and the center of the opening area to the distance between the first intersection point and the center of the opening area is 1.75 to 1.80. In some embodiments, the ratio of the distance between the center of the orthographic projection of the adjacent connecting portion on the substrate and the center of the opening area to the distance between the first intersection point and the center of the opening area is 1.7 to 1.85. In some embodiments, the ratio of the distance between the center of the orthographic projection of the adjacent connecting portion on the substrate and the center of the opening area to the distance between the first intersection point and the center of the opening area is 1.75 to 1.90.

The present disclosure further provides a touch panel, including: a substrate, and a plurality of first touch electrodes and a plurality of second touch electrodes arranged on the substrate. The plurality of first touch electrodes extend in a first direction. At least one first touch electrode includes a plurality of first sub-electrodes electrically connected to one another. The plurality of second touch electrodes extend in a second direction intersecting the first direction. For example, the second direction is perpendicular to the first direction. At least one second touch electrode includes a plurality of second sub-electrodes electrically connected to one another. A plurality of connecting portions are provided at intersections of the plurality of first touch electrodes and the plurality of second touch electrodes. At least one connecting portion is located between and electrically connected to two first sub-electrodes that are adjacent in the first direction, and is located between and electrically connected to two second sub-electrodes that are adjacent in the second direction. At the at least one connecting portion, the first touch electrode and the second touch electrode are electrically insulated from one another.

The touch panel includes an opening area. The connecting portion includes a first connecting portion, a second connecting portion, a third connecting portion and a fourth connecting portion. The opening area is surrounded by the first connecting portion, the second connecting portion, the third connecting portion and the fourth connecting portion. The first connecting portion and the second connecting portion are adjacent in the first direction and are electrically connected to a same first sub-electrode. The third connecting portion and the fourth connecting portion are adjacent in the first direction and are electrically connected to a same first sub-electrode. The first connecting portion and the third connecting portion are adjacent in the second direction and are electrically connected to a same second sub-electrode. The second connecting portion and the fourth connecting portion are adjacent in the second direction and are electrically connected to a same second sub-electrode.

For at least one connecting portion of the first connecting portion, the second connecting portion, the third connecting portion and the fourth connecting portion, a first straight line connecting centers of orthographic projections of at least two other connecting portions of the first touch electrode where the at least one connecting portion is located on the substrate extends in the first direction, and a second straight line connecting centers of orthographic projections of at least two other connecting portions of the second touch electrode where the at least one connecting portion is located on the substrate extends in the second direction. The first straight line and the second straight line intersect at an intersection point. A center of an orthographic projection of the at least one connecting portion on the substrate is located on a side of the intersection point away from the center of the opening area. An orthographic projection of a straight line connecting the center of the orthographic projection of the at least one connecting portion on the substrate and the center of the opening area in the first direction has a length greater than or equal to that of an orthographic projection of a straight line connecting the intersection point and the center of the opening area in the first direction. An orthographic projection of a straight line connecting the center of the orthographic projection of the at least one connecting portion on the substrate and the center of the opening area in the second direction has a length greater than or equal to that of an orthographic projection of a straight line connecting the intersection point and the center of the opening area in the second direction.

In the touch panel described above, by designing a shape and a connection relationship of the first sub-electrode of the first touch electrode and the second sub-electrode of the second touch electrode around the opening area, it is avoided to use an additional bridging structure that bypasses the opening area so as to connect two adjacent first sub-electrodes in the same first touch electrode separated by the opening area or connect two adjacent second sub-electrodes in the same second touch electrode separated by the opening area. In this way, while ensuring a touch function of the first sub-electrode and the second sub-electrode around the opening area, a process difficulty is reduced, and an anti-static ability is enhanced.

Figure 2:
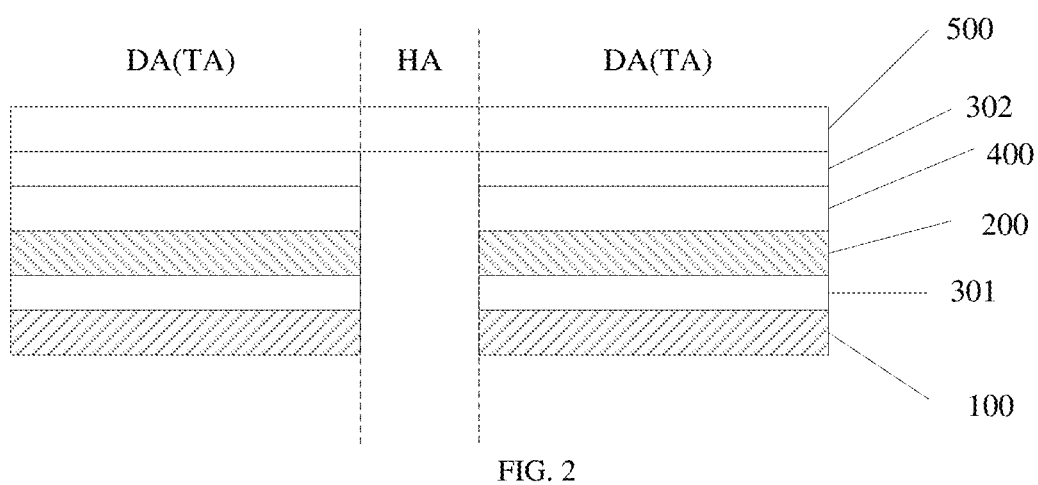
FIG. 2 shows a schematic diagram of a cross-sectional structure of the touch display panel in FIG. 1, taken along line A-A'.

Some embodiments of the present disclosure provide a touch display panel. FIG. 1 shows a schematic diagram of a planar structure of a touch display panel according to some embodiments of the present disclosure. FIG. 2 shows a schematic cross-sectional view of the touch display panel in FIG. 1, taken along line A-A'. As shown in FIG. 1 and FIG. 2, a touch display panel 1000 includes a display panel 100 and a touch panel 200 located on a display surface side of the display panel 100. The touch panel 200 is attached to the display surface side of the display panel 100 through a first adhesive 301. The display panel 100 may be, for example, an OLED display panel. The touch panel 200 is attached to the display panel in an external mode so as to form a touch display panel. Those skilled in the art may understand that in other embodiments, the touch panel 200 may be integrated in the display panel 100 so that the touch display panel is formed by an IN-CELL mode. In some embodiments, an aspect ratio of the touch display panel 1000 is 2 to 2.5, such as 2.14. In some embodiments, the touch display panel 1000 has four rounded corners. That is, the touch display panel 1000 has curved edges at four corners.

As shown in FIG. 1 and FIG. 2, in some embodiments, the touch display panel 1000 further includes a polarizer 400 attached to a side of the touch panel 200 away from the display panel. The touch display panel 1000 includes a touch display area AA and an opening area HA located in the touch display area AA. The opening area HA penetrates the display panel 100, the touch panel 200 and the polarizer 400. Those skilled in the art may understand that in some embodiments, the polarizer 400 may be omitted.

The touch display area AA in the present disclosure refers to a screen area of the touch display panel, which corresponds to a display area of the display panel 100 and a touch area of the touch panel. An opening may be made in the opening area HA by mechanical punching, laser drilling, etc., for placing components such as cameras. In some embodiments, an opening penetrating both the touch panel 200 and the display panel 100 may be formed after the touch panel 200 and the display panel 100 are bonded together. In another embodiment, the touch panel 200 and the display panel 100 may be punched separately and then bonded together, so that openings of the two panels are aligned to form an opening that penetrates the touch panel 200 and the display panel 100.

For the display panel 100, the display panel 100 includes the opening area HA and an effective display area DA surrounding the opening area HA. For the touch panel 200, the display panel 100 includes the opening area HA and an effective touch area TA surrounding the opening area HA. The effective display area DA and the effective touch area TA may be collectively referred to as an effective touch display area.

In some embodiments, as shown in FIG. 1 and FIG. 2, the touch display panel 1000 further includes a cover plate 500. The cover plate 500 is attached to a side of the polarizer 400 away from the touch panel 200 by a second adhesive 302, so as to protect other components.

Figure 3:
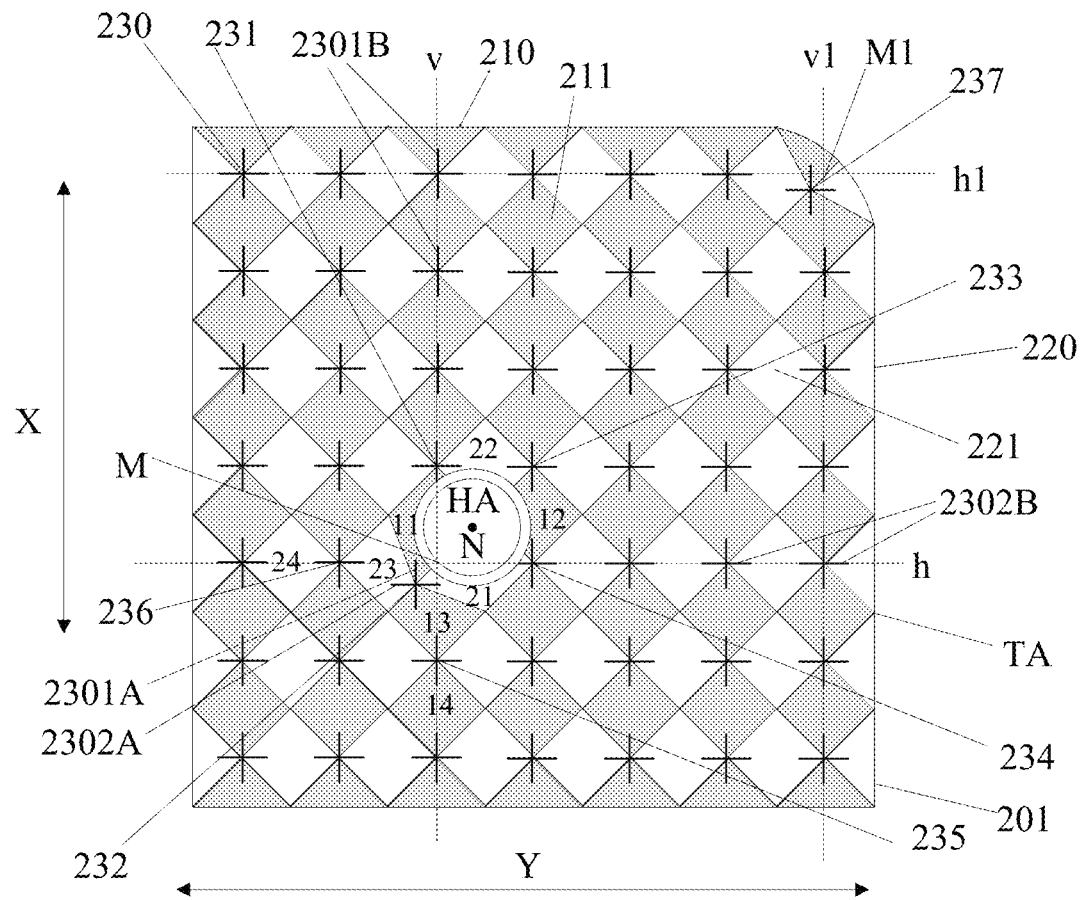
FIG. 3 shows a schematic diagram of a partial planar structure of a touch panel according to some embodiments of the present disclosure.

A specific structure of the touch panel 200 is explained in detail below. Some embodiments of the present disclosure provide a touch panel. FIG. 3 shows a schematic diagram of a partial planar structure of a touch panel according to some embodiments of the present disclosure. As shown in FIG. 3, the touch panel 200 includes: a substrate 201, and a plurality of first touch electrodes 210 and a plurality of second touch electrodes 220 arranged on the substrate 201. The plurality of first touch electrodes 210 extend in a first direction X. At least one first touch electrode 210 includes a plurality of first sub-electrodes 211 electrically connected to one another. The plurality of second touch electrodes 220 extend in a second direction Y intersecting the first direction X. For example, the second direction Y is perpendicular to the first direction X. At least one second touch electrode 220 includes a plurality of second sub-electrodes 221 electrically connected to one another. A plurality of connecting portions 230 are provided at intersections of the plurality of first touch electrodes 210 and the plurality of second touch electrodes 220. At least one connecting portion 230 is located between and electrically connected to two first sub-electrodes 211 that are adjacent in the first direction X, and is also located between and electrically connected to two second sub-electrodes 221 that are adjacent in the second direction Y. At the at least one connecting portion 230, the first touch electrode 210 and the second touch electrode 220 are electrically insulated from one another.

With reference to FIG. 1 and FIG. 10 to FIG. 13, it may be considered that each first touch electrode 10 includes a plurality of first sub-electrodes 211 electrically connected to one another and a plurality of first connecting sub-portions 2301 located between and electrically connected to every two adjacent first sub-electrodes 211, and each second touch electrode 20 includes a plurality of second sub-electrodes 221 electrically connected to one another and a plurality of second connecting sub-portions 2302 located between and electrically connected to every two adjacent second sub-electrodes 221. The first connecting sub-portion 2301 and the second connecting sub-portion 2302 have a partially overlapping area, and a stacked structure formed thereby is the connecting portion 230. The touch panel 200 includes the opening area HA surrounded by the effective touch area TA. The first touch electrodes 210, the second touch electrodes 220 and the connecting portions 230 are all located in the effective touch area TA. As shown in FIG. 3, the connecting portion 230 includes a first connecting portion 231, a second connecting portion 232, a third connecting portion 233 and a fourth connecting portion 234. The opening area HA is surrounded by the first connecting portion 231, the second connection portion 232, the third connection portion 233 and the fourth connection portion 234. The first connecting portion 231, the second connecting portion 232, the third connecting portion 233 and the fourth connecting portion 234 are closer to the opening area HA than other connecting portions 230. The first connecting portion 231 and the second connecting portion 232 are adjacent in the first direction X and are electrically connected to a same first sub-electrode 211 (denoted as a first sub-electrode 11, as shown in FIG. 3). The third connecting portion 233 and the fourth connecting portion 234 are adjacent in the first direction X and are electrically connected to a same first sub-electrode 211 (denoted as a first sub-electrode 12, as shown in FIG. 3). The first connecting portion 231 and the third connecting portion 233 are adjacent in the second direction Y and are electrically connected to a same second sub-electrode 221 (denoted as a second sub-electrode 22, as shown in FIG. 3). The second connecting portion 232 and the fourth connecting portion 234 are adjacent in the second direction Y and are electrically connected to a same second sub-electrode 221 (denoted as a second sub-electrode 21, as shown in FIG. 3).

In this embodiment, the second connecting portion 232 is illustrated by way of example in describing at least one connecting portion 230 of the first connecting portion 231, the second connecting portion 232, the third connecting portion 233 and the fourth connecting portion 234. For example, as shown in FIG. 3, the first touch electrode 210 where the second connecting portion 232 includes a first adjacent connecting sub-portion 2301A which is adjacent to the opening area HA and some other first connecting sub-portions 2301B, and the second touch electrode 220 where the second connecting portion 232 is located includes a second adjacent connecting sub-portion 2302A which is adjacent to the opening area HA and some other second connecting sub-portions 2302B. For the sake of clarity, two of the some other first connecting sub-portions 2301B and two of some other second connecting sub-portions 2302B are indicated in FIG. 3. A first straight line connecting centers of orthographic projections of at least two other connecting portions of the first touch electrode 210 where the second connecting portion 232 is located on the substrate extends in the first direction. For example, the first straight line is a straightly center line v of the orthographic projection of the first touch electrode 210 where the second connecting portion 232 is located on the substrate 201 in the first direction X. A second straight line connecting centers of orthographic projections of at least two other connecting portions of the second touch electrode 220 where the second connecting portion 232 is located on the substrate extends in the second direction. For example, the second straight line is a straightly center line h of the orthographic projection of the second touch electrode 220 where the second connecting portion 232 is located on the substrate 201 in $2^{nd}$ first direction Y. The first straight line and the second straight line intersect at an intersection point M. It may be considered that the intersection point M is located at an intersection of the first touch electrode 210 where the second connecting portion 232 is located and the second touch electrode 220 where the second connecting portion 232 is located. A center of the orthographic projection of the second connecting portion 232 on the substrate 201 is located on a side of the intersection point M away from a center N of the opening area HA. An orthographic projection of a straight line connecting the center of the orthographic projection of the second connecting portion 232 on the substrate 201 and the center N of the opening area HA in the first direction X has a length greater than or equal to that of an orthographic projection of a straight line connecting the intersection point M and the center N of the opening area HA in the first direction X. An orthographic projection of a straight line connecting the center of the orthographic projection of the second connecting portion 232 on the substrate 201 and the center N of the opening area HA in the second direction Y has a length greater than or equal to that of an orthographic projection of a straight line connecting the intersection point M and the center N of the opening area HA in the second direction Y. On the whole, the center of the orthographic projection of the second connecting portion 232 on the substrate 201 is farther away from the center N of the opening area HA than the intersection point M.

In some embodiments, the straight line connecting the center of the orthographic projection of the connecting portion 232 on the substrate 201 and the center N of the opening area HA has a length greater than that of a straight line connecting the intersection M and the center N of the opening area HA.

In some embodiments, the connecting portion 232 is not located on the first straight line connecting the centers of the orthographic projections of the other at least two connecting portions of the first touch electrode 210 on the substrate. For example, the second connecting portion 232 is not located on the straight center line v of the orthographic projection of the first touch electrode 210 where the second connecting portion 232 is located on the substrate 201 in the first direction X. In some embodiments, a line connecting the connecting portion and at least one of the other connecting portions of the first touch electrode 210 where the connecting portion is located forms an included angle with the center line v. For example, the included angle is an acute angle, that is, has a value greater than 0° and less than 90°. For example, the included angle has a value of 10°~80°, 20°~70°, 30°~60°, or 40°~50°. Certainly, the included angle may also be an acute angle of other values.

The connecting portion 232 is not located on the second straight line connecting the centers of the orthographic projections of the at least two other connecting portions of the second touch electrode 220 where the connecting portion 232 is located on the substrate 201. For example, the connecting portion 232 is not located on the center line h of the orthographic projection of the second touch electrode 220 on the substrate 201 in the second direction Y. In some embodiments, a line connecting the connecting portion and at least one of the other connecting portions of the second touch electrode 220 where the connecting portion is located forms an included angle with the center line h. For example, the included angle is an acute angle, that is, has a value greater than 0° and less than 90°. For example, the included angle has a value of 10°~80°, 20°~70°, 30°~60°, or 40°~50°. Certainly, the included angle may also be an acute angle of other values.

In the embodiments described above, each of the centers of the orthographic projections of the other connecting portions 230 of the first touch electrode 210 where the second connecting portion 232 is located on the substrate 201 (hereinafter referred to as the centers of the other connecting portions 230) is located on the center line v of the orthographic projection of the first touch electrode 210 on the substrate 201 in the first direction X. Each of the centers of the orthographic projections of the other connecting portions 230 of the second touch electrode 220 where the second connecting portion 232 is located on the substrate 201 is located on the center line h of the orthographic projection of the second touch electrode 220 on the substrate 201 in the second direction Y. Such a structure facilitates the design of the touch panel 200.

Based on the design, the first sub-electrode 11 and the second sub-electrode 21 that are electrically connected to the second connecting portion 232 and that are located in proximity to the opening area HA may have a larger area, so as to ensure a touch effect of the touch sub-electrodes in proximity to the opening area HA (including the first sub-electrode and the second sub-electrode) and prevent a touch failure in an area in proximity to the opening area HA.

Here, unless otherwise defined, the center of the connecting portion generally refers to the center of the orthographic projection of the connecting portion on the substrate.

In some embodiments, adjacent first sub-electrodes are only electrically connected through the first connecting portion, and adjacent second sub-electrodes are only electrically connected through the second connecting portion.

In some embodiments, at least two of a distance from the center of the opening area to the center of the orthographic projection of the first connecting portion on the substrate, a distance from the center of the opening area to the center of the orthographic projection of the second connecting portion on the substrate, a distance from the center of the opening area to the center of the orthographic projection of the third connecting portion on the substrate and a distance from the center of the opening area to the center of the orthographic projection of the fourth connecting portion on the substrate are different from one another.

In some embodiments, any two of the distance from the center of the opening area to the center of the orthographic projection of the first connecting portion on the substrate, the distance from the center of the opening area to the center of the orthographic projection of the second connecting portion on the substrate, the distance from the center of the opening area to the center of the orthographic projection of the third connecting portion on the substrate and the distance from the center of the opening area to the center of the orthographic projection of the fourth connecting portion on the substrate are different from one another.

In order to understand the advantages of the embodiments described above more intuitively, the embodiments described above are compared with the related technical solutions introduced below.

Figure 4:
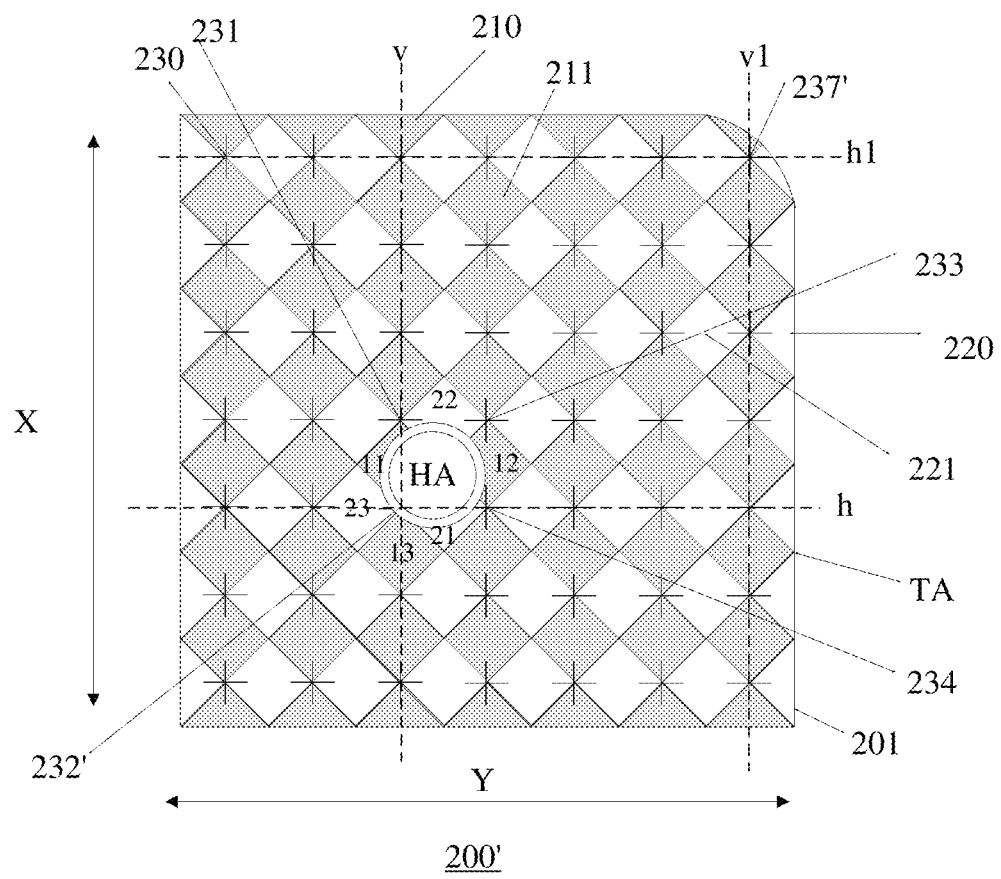
FIG. 4 shows a schematic diagram of a partial planar structure of a touch panel in the related art.

FIG. 4 shows a schematic diagram of a partial structure of a touch panel 200' in the related art. In the related art shown in FIG. 4, the touch panel 200' includes a substrate 201 as well as a plurality of first touch electrodes 210 and a plurality of second touch electrodes 220 arranged on the substrate 201. The plurality of first touch electrodes 210 extend in a first direction X. At least one first touch electrode 210 includes a plurality of first sub-electrodes 211 electrically connected to one another. The plurality of second touch electrodes 220 extend in a second direction Y that intersects the first direction X. For example, the second direction Y is perpendicular to the first direction X. At least one second touch electrode 220 includes a plurality of second sub-electrodes 221 electrically connected to one another. A plurality of connecting portions 230 are provided at intersections of the plurality of first touch electrodes 210 and the plurality of second touch electrodes 220. At least one connecting portion 230 is located between and electrically connected to two first sub-electrodes 221 that are adjacent in the first direction X, and is also located between and electrically connected to two second sub-electrodes 221 that are adjacent in the second direction Y. At the at least one connecting portion 230, the first touch electrode 210 and the second touch electrode 220 are electrically insulated from one another. As shown in FIG. 4, for any first touch electrode 210, each of the centers of the plurality of connecting portions 230 of the first touch electrode 210 is located on a center line of the orthographic projection of the first touch electrode 210 on the substrate 201 in the first direction X. For any second touch electrode 220, each of the centers of the plurality of connecting portions 230 of the second touch electrode 220 is located on a center line of the orthographic projection of the second touch electrode 220 on the substrate 201 in the second direction Y.

In order to achieve a full-screen design, it is necessary to punch the touch panel 200', and the opening area HA is designed accordingly. The opening in the art generally has a diameter of 3 mm to 5 mm, for example 4 mm. In order to prevent the opening in the touch panel 200' from producing a great impact on the touch effect, the center of the opening area HA is usually set in proximity to a center of a rectangle formed by centers of four adjacent connecting portions. The centers of these four adjacent connecting portions are respectively located at four vertices of the rectangle. In this case, the opening area may be designed to avoid covering the connecting portion 230 or to cover the connecting portion 230 as little as possible, so that as many first touch electrodes 210 and/or second touch electrodes 220 as possible may keep signals unblocked.

As shown in FIG. 4, the center of the opening area HA is located in proximity to a center of a rectangle with the centers of the first connecting portion 231, the second connecting portion 232', the third connecting portion 233 and the fourth connecting portion 234 as four vertices. The opening area HA covers the second connecting portion 232'. If an opening is made in the opening area HA, the second connecting portion 232' may be removed, and the first touch electrode 210 where the second connecting portion 232' is located may be disconnected, that is, the first sub-electrode 11 and the first sub-electrode 13 of the first touch electrode 210 that were originally electrically connected by the second connecting portion 232' are disconnected. Further, the second touch electrode 220 where the second connecting portion 232' is located is disconnected, that is, the second sub-electrode 21 and the second sub-electrode 23 of the second touch electrode 220 that were originally electrically connected by the second connecting portion 232' are disconnected. In the related art, in order to make the first touch electrode 210 and the second touch electrode 220 where the second touch connecting portion 232' is located to keep signals unblocked, the first sub-electrode 11 and the first sub-electrode 13 may be electrically connected through an additional first bridge, and the second sub-electrode 21 and the second sub-electrode 23 may be electrically connected through an additional second bridge. The first bridge and the second bridge are arranged to bypass the opening area HA. However, after metal bridging is performed by bypassing the opening area HA, the first sub-electrode 11 and the first sub-electrode 13 electrically connected by the first bridge as well as the second sub-electrode 21 and the second sub-electrode 23 electrically connected by the second bridge in proximity to the opening area HA have poor anti-static capabilities. Further, as shown in FIG. 4, the first sub-electrode 11 and the second sub-electrode 21 are partially cut off by the opening area HA and have a smaller area. Even if the signals of the first touch electrode 210 where the first sub-electrode 11 is located and the second touch electrode 220 where the second sub-electrode 21 is located are kept unblocked by means of bridging, the touch effect at the first sub-electrode 11 and the second sub-electrode 21 is poor, and a touch at this position may not be recognized.

Comparing the related art shown in FIG. 4 with the solution of the embodiment shown in FIG. 3, the center of the second connecting portion 232' in FIG. 4 corresponds to the intersection point M shown in FIG. 3. It may be considered that the solution of the embodiment shown in FIG. 3 is obtained by moving the second connecting portion 232' in the related art shown in FIG. 4 in a direction away from the opening area HA, for example, to a position where the second connecting portion 232 in FIG. 3 is located, and by changing shapes of the first sub-electrode 11, the first sub-electrode 13, the second sub-electrode 21 and the second sub-electrode 23. As a result, the moved second connecting portion 232 (as shown in FIG. 3) avoids the opening area HA. Further, the first sub-electrode 11 and the first sub-electrode 13 are electrically connected through the second connecting portion 232, and the second sub-electrode 21 and the second sub-electrode 23 are electrically connected through the second connecting portion 232. In this way, no additional metal bridge is required, and the problem of poor anti-static ability is avoided. Moreover, as shown in FIG. 3 and FIG. 4, the area of the first sub-electrode 11 in FIG. 3 is significantly larger than that of the first sub-electrode 11 in the related art shown in FIG. 4, and the area of the second sub-electrode 21 in FIG. 3 is significantly larger than that of the second sub-electrode 21 in the related art shown in FIG. 4. Based on such settings, in the embodiment shown in FIG. 3, the first sub-electrode 11 and the second sub-electrode 21 that are electrically connected to the second connecting portion 232 and that are located in proximity to the opening area HA have a larger area, so as to ensure the touch effect of the touch sub-electrodes in proximity to the opening area HA (including the first sub-electrode and the second sub-electrode) and avoid a touch failure in the area in proximity to the opening area HA.

Those skilled in the art may understand that the opening of the touch panel 200' needs to be aligned with the opening of the display panel. In some specific cases, when the first sub-electrode 211 and the second sub-electrode 221 are regularly arranged as shown in FIG. 4 and the first sub-electrode 211 and the second sub-electrode 221 have a size of a certain set value, the center of the opening of the touch panel 200' may be close to a certain connecting portion. Even if the connecting portion is moved on the basis of the related art, it is difficult to avoid using a bridging method to ensure unblocked signals of the first touch electrode 210 and/or the second touch electrode 220 where the connecting portion is located. In this case, a width of the first touch electrode 210 and/or a width of the second touch electrode 220 may be adjusted so that the center of the opening of the touch panel 200' is located in proximity to the center of the rectangle formed by the centers of the four adjacent connecting portions. The width of the first touch electrode 210 mentioned here may be regarded as a length of a diagonal of the first sub-electrode 211 having a rhombic or square shape in FIG. 4 in the second direction Y, and the width of the second touch electrode 220 may be regarded as a length of a diagonal of the second sub-electrode 211 having a rhombic or square shape in FIG. 4 in the first direction X.

Continuing to refer to FIG. 3, the second connecting portion 232 is still illustrated by way of example. The second connecting portion 232 is located between and electrically connected to a $1^{st}$ first sub-electrode 11 and a $2^{nd}$ first sub-electrode 13 that are adjacent in the first direction X. The $1^{st}$ first sub-electrode 11 is closer to the opening area HA than the $2^{nd}$ first sub-electrode 13. The touch panel 200 further includes a 3rd first sub-electrode 14 on a side of the $2^{nd}$ first sub-electrode 13 away from the $1^{st}$ first sub-electrode 11. The 3rd first sub-electrode 14 is adjacent to and electrically connected to the $2^{nd}$ first sub-electrode 13 through a fifth connecting portion 235. The 3rd first sub-electrode 14 is a normal first sub-electrode. The normal first sub-electrode mentioned here refers to the first sub-electrode in the effective touch area TA that basically has a regular pattern, such as a rhombus, a square, a grid line, etc.

The second connecting portion 232 is located between and electrically connected to a $1^{st}$ second sub-electrode 21 and a $2^{nd}$ second sub-electrode 23 that are adjacent in the second direction Y. The $1^{st}$ second sub-electrode 21 is closer to the opening area HA than the $2^{nd}$ second sub-electrode 23. The touch panel further includes a 3rd second sub-electrode 24 on a side of the $2^{nd}$ second sub-electrode 23 away from the $1^{st}$ second sub-electrode 21. The 3rd second sub-electrode 24 is adjacent to and electrically connected to the $2^{nd}$ second sub-electrode 23 through a sixth connecting portion 236. The 3rd second sub-electrode 24 is a normal second sub-electrode. The normal second sub-electrode mentioned here refers to the second sub-electrode in the effective touch area TA that basically has a regular pattern, such as a rhombus, a square, a grid line, etc.

Compared with the related art shown in FIG. 4, it may be considered that the embodiment shown in FIG. 3 is obtained by moving the second connecting portion 232' in a direction away from the center of the opening area HA on the basis of the related art shown in FIG. 4. Accordingly, an area of the $1^{st}$ first sub-electrode 11 and an area of the $2^{nd}$ first sub-electrode 13 are changed. Specifically, the area of the $1^{st}$ first sub-electrode 11 is increased, and the area of the $2^{nd}$ first sub-electrode 13 is decreased. At the same time, an area of the $1^{st}$ second sub-electrode 21 and an area of the $2^{nd}$ second sub-electrode 23 are changed accordingly. Specifically, the area of the $1^{st}$ second sub-electrode 21 is increased, and the area of the $2^{nd}$ second sub-electrode 23 is decreased. In this way, it is avoided that the first sub-electrode and/or the second sub-electrode in proximity to the opening area HA have a too small area, so that the problem of poor touch or touch failure at the position is avoided.

In some embodiments, referring to FIG. 3, an area of the $1^{st}$ first sub-electrode 11 is not less than 50% of an area of the normal first sub-electrode such as the $3^{rd}$ first sub-electrode 14, and an area of the $2^{nd}$ first sub-electrode is not less than 70% of the area of the normal first sub-electrode such as the $3^{rd}$ first sub-electrode 14. An area of the $1^{st}$ second sub-electrode 21 is not less than 50% of an area of the normal second sub-electrode such as the $3^{rd}$ second sub-electrode 24, and an area of the $2^{nd}$ second sub-electrode is not less than 70% of the area of the normal second sub-electrode such as the $3^{rd}$ second sub-electrode 14. In this way, it is avoided that the first sub-electrode and/or the second sub-electrode around the opening area HA have a too small area, so that an area uniformity is good, and the problem of poor touch or touch failure at the position is avoided.

Figure 5:
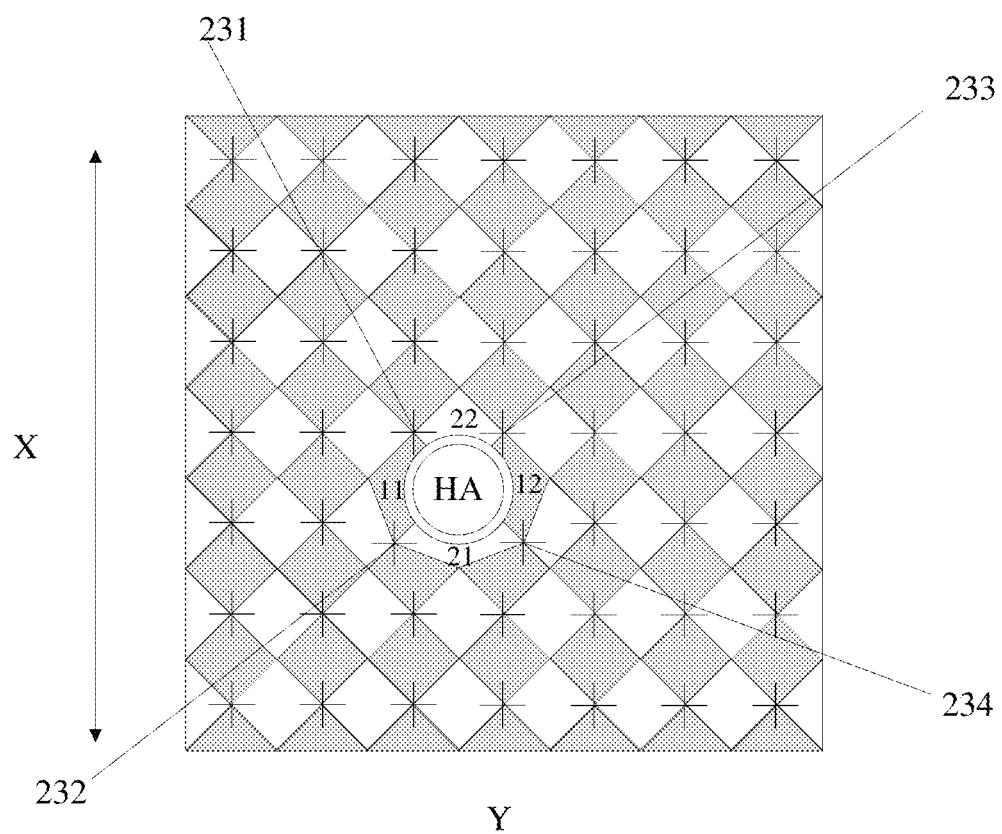
FIG. 5 to FIG. 7 show schematic diagrams of a partial planar structure of a touch panel according to some embodiments of the present disclosure.
Figure 6:
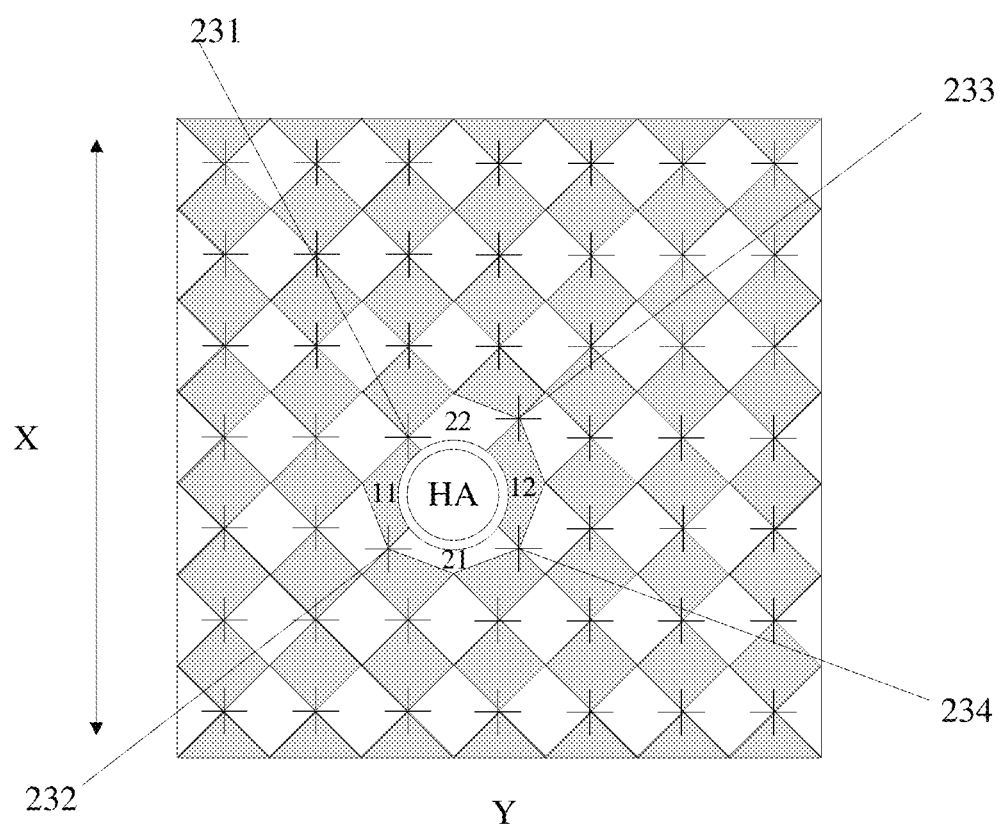
Figure 7:
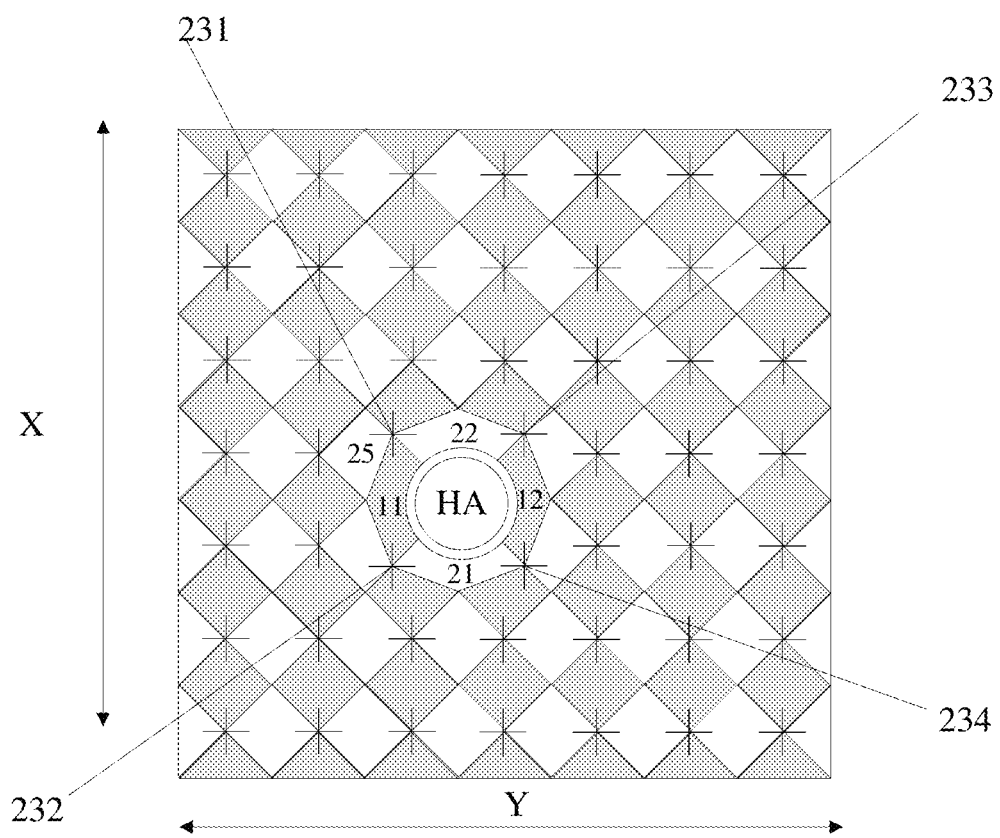

FIG. 5 to FIG. 7 show schematic diagrams of partial planar structures of a touch panel according to some embodiments. The planar structure of the touch panel shown in FIG. 5 is obtained by moving the second connecting portion 232 and the fourth connecting portion 234 on the basis of the related art, in a manner similar to that shown in FIG. 3 where the second connecting portion 232 is moved away from the center of the opening area HA on the basis of the related art. The planar structure of the touch panel shown in FIG. 6 is obtained by moving the second connecting portion 232, the third connecting portion 233 and the fourth connecting portion 234 on the basis of the related art, in a manner similar to that shown in FIG. 3 where the second connecting portion 232 is moved away from the center of the opening area HA on the basis of the related art. The planar structure of the touch panel shown in FIG. 7 is obtained by moving the first connecting portion 231, the second connecting portion 232, the third connecting portion 233 and the fourth connecting portion 234 on the basis of the related art, in a manner similar to that shown in FIG. 3 where the second connecting portion 232 is moved away from the center of the opening area HA on the basis of the related art.

As shown in FIG. 5 to FIG. 7, the area of at least one of the first sub-electrode 11, the first sub-electrode 12, the second sub-electrode 21 and the second sub-electrode 22 around the opening area HA is increased compared to the related art. In this way, it is avoided that the first sub-electrode and/or the second sub-electrode around the opening area HA have a too small area, so that the area uniformity is good, and the problem of poor touch or touch failure at the position is avoided.

In some embodiments, as shown in FIG. 7, the first connecting portion 231, the second connecting portion 232, the third connecting portion 233 and the fourth connecting portion 234 are moved away from the center of the opening area HA on the basis of the related art, so as to increase the areas of the first sub-electrode 11, the first sub-electrode 12, the second sub-electrode 21 and the second sub-electrode 22 while reducing the areas of the other first sub-electrodes 211 and second sub-electrodes 221 adjacent thereto. For example, the first connecting portion 231 is moved away from the center of the opening area HA, so as to increase the area of the first sub-electrode 11 while reducing the area of a second sub-electrode 25 adjacent to the first sub-electrode 11.

Those skilled in the art may understand that when the opening area HA in the related art has a predetermined size, improvements may be made by using the embodiments shown in FIG. 3 and FIG. 5 to FIG. 7. An area S of the opening area HA satisfies a formula of $2S1 \leq S \leq 4S1$, where S1 indicates an average value of the area of the normal first sub-electrode and the area of the normal second sub-electrode.

When the opening area HA is too small, the problem of poor touch or touch failure may not be present around the opening area HA in the related art. When the opening area HA is too large, even if the embodiments shown in FIG. 3 and FIG. 5 to FIG. 7 are adopted, it may still be necessary to adopt additional bridges to ensure the signal conduction of the first touch electrode 210 and/or the second touch electrode 220.

In some embodiments, the normal first sub-electrode and the normal second sub-electrode have the same shape and area.

Figure 8:
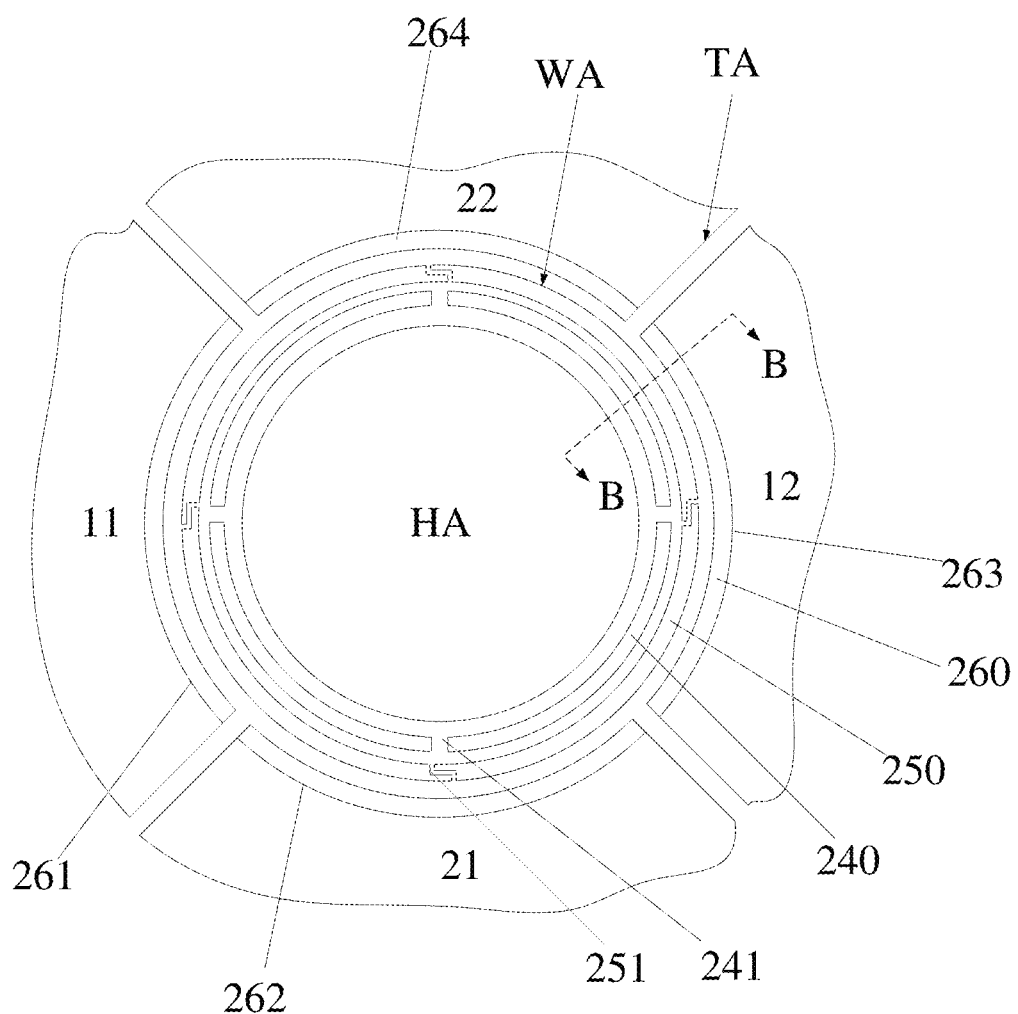
FIG. 8 shows a partial enlarged view of an opening area HA in FIG. 3.

FIG. 8 shows a partial enlarged view of the opening area HA in FIG. 3. FIG. 8 shows the opening area HA as well as the first sub-electrode 11, the first sub-electrode 12, the second sub-electrode 21 and the second sub-electrode 22 around the opening area HA. As shown in FIG. 8, the first sub-electrode 11, the first sub-electrode 12, the second sub-electrode 21 and the second sub-electrode 22 are all located in the effective touch area TA that surrounds the opening area HA. The touch panel 200 further includes a wiring area WA. The wiring area WA is arranged around the opening area HA and is located between the effective touch area TA and the opening area HA.

As shown in FIG. 8, the touch panel 200 further includes an anti-cracking ring 240 located in the wiring area WA, which is made of a conductive material. The anti-cracking ring 240 is arranged around the opening area HA and is formed as a ring with at least one first opening 241. The anti-cracking ring 240 is disconnected at the first opening 241. The anti-cracking ring 240 is used to prevent a spread of cracks generated when the opening is made in the opening area HA, so as to avoid an impact on the effective touch area TA. The anti-cracking ring 240 is a discontinuous ring to avoid signal shielding caused by a closed ring made of a conductive material.

As shown in FIG. 8, the touch panel 200 further includes an anti-static ring 250 located in the wiring area WA. The anti-static ring 250 is arranged around the anti-cracking ring 240 and is formed as a ring with at least one second opening 251. The second opening 251 is, for example, a Z-shaped opening. The anti-static ring 250 is configured to prevent static electricity from entering the effective touch area TA and causing an adverse effect. The anti-static ring 250 is disconnected at the second opening 251 and is formed as a discontinuous ring so as to avoid signal shielding caused by a closed ring made of a conductive material. The second opening 251 is aligned with the first opening 241.

As shown in FIG. 8, the touch panel 200 further includes a connecting ring 260 located at a boundary between the wiring area WA and the effective touch area TA. The connecting ring 260 surrounds the anti-static ring 250. The connecting ring 260 is a discontinuous ring and includes a first connecting sub-ring 261, a second connecting sub-ring 262, a third connecting sub-ring 263 and a fourth connecting sub-ring 264. The first connecting sub-ring 261 and the second connecting sub-ring 262 are disconnected at a boundary between the first sub-electrode 11 and the second sub-electrode 21. The second connecting sub-ring 262 and the third connecting sub-ring 263 are disconnected at a boundary between the second sub-electrode 21 and the first sub-electrode 12. The third connecting sub-ring 263 and the fourth connecting sub-ring 264 are disconnected at a boundary between the first sub-electrode 12 and the second sub-electrode 22. The first connecting sub-ring 261 and the fourth connecting sub-ring 264 are disconnected at a boundary between the first sub-electrode 11 and the second sub-electrode 22. The first connecting sub-ring 261, the second connecting sub-ring 262, the third connecting sub-ring 263 and the fourth connecting sub-ring 264 correspond to and are electrically connected to the first sub-electrode 11, the second sub-electrode 21, the first sub-electrode 12 and the second sub-electrode 22, respectively. A relative positional relationship between each connecting sub-ring and the corresponding sub-electrode is basically the same.

Figure 9:
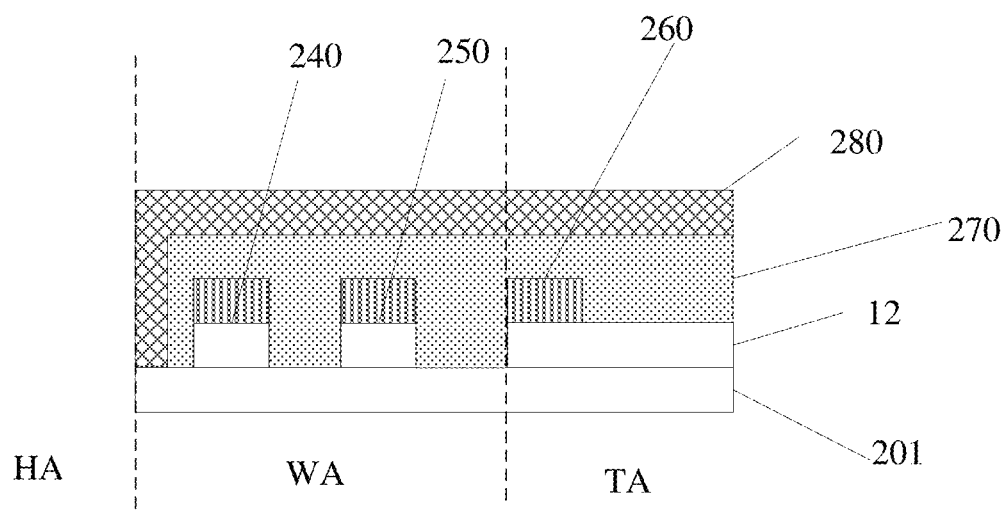
FIG. 9 shows a schematic cross-sectional view of the structure in FIG. 8, taken along line B-B'.

The third connecting sub-ring 263 and the corresponding first sub-electrode 12 are illustrated below by way of example. FIG. 9 shows a schematic cross-sectional view of the structure in FIG. 8, taken along line B-B'. As shown in FIG. 8 and FIG. 9, the third connecting sub-ring 263 is in direct electrical contact with the first sub-electrode 12. Specifically, the third connecting sub-ring 263 is located on a side of the first sub-electrode 12 away from the substrate 201, and an orthographic projection of the third connecting sub-ring 263 on the substrate 201 falls within the orthographic projection of the first sub-electrode 12 on the substrate 201. The third connecting sub-ring 263 is connected in parallel with the first sub-electrode 12, so that an impedance of the first sub-electrode 12 is reduced, and an attenuation of the signal passing through the first sub-electrode 12 is reduced. The first sub-electrode 12 may be made of a transparent conductive material such as ITO or IZO. The third connecting sub-ring 263 may, for example, have a single-layer structure made of a metal material, and directly overlaps the first sub-electrode 12.

At least one of the anti-cracking ring 240 and the anti-static ring 250 may, for example, have a double-layer structure, including a first sub-layer and a second sub-layer. The first sub-layer may be made of the same material and arranged in the same layer as the first sub-electrode 12. The second sub-layer may be made of the same material and arranged in the same layer as the third connecting sub-ring 263.

As shown in FIG. 8 and FIG. 9, the touch panel further includes a first insulating layer 270 and a second insulating layer 280 that are located on a side of the third connecting sub-ring 263 away from the substrate 201 and that are arranged sequentially away from the substrate 201.

In some embodiments, the first sub-electrode 11, the second sub-electrode 21, the first sub-electrode 12 and the second sub-electrode 22 are all made of the same material and arranged in the same layer.

In some embodiments, FIG. 3 further shows a schematic structural diagram of a corner of the touch panel 200. As shown in FIG. 3, the corner of the touch panel 200 is rounded, that is, the touch panel 200 has a curved edge at the corner. Those skilled in the art may understand that the touch panel 200 has four corners, and only one corner is shown in FIG. 3 for illustration.

As shown in FIG. 3, the touch panel 200 includes a seventh connecting portion 237 in proximity to the curved edge of the touch panel 200. The seventh connecting portion 237 is electrically connected to at least one first sub-electrode 211 or second sub-electrode 221 adjacent to the curved edge. A fifth straight line connecting centers of orthographic projections of at least two other connecting portions of the first touch electrode 210 where the second connecting portion 237 is located on the substrate extends in the first direction. For example, the fifth straight line is a center line v1 of the orthographic projection of the first touch electrode 210 where the seventh connecting portion 232 is located on the substrate 201 in the first direction X. A sixth straight line connecting centers of orthographic projections of at least two other connecting portions of the second touch electrode 220 where the seventh connecting portion 237 is located on the substrate extends in the second direction Y. For example, the sixth straight line is a center line hl of the orthographic projection of the second touch electrode 220 where the seventh connecting portion 237 is located on the substrate 201 in the second direction Y. The fifth straight line and the sixth straight line intersect at an intersection point M1. It may be considered that the intersection point M1 is located at an intersection of the first touch electrode 210 where the seventh connecting portion 237 is located and the second touch electrode 220 where the seventh connecting portion 237 is located. The center of the orthographic projection of the seventh connecting portion 237 on the substrate 201 is located on a side of the intersection point M1 away from the curved edge.

In the related art shown in FIG. 4, a seventh connecting portion 237' corresponds to the seventh connecting portion 237. As shown in FIG. 4, the seventh connecting portion 237' is located in proximity to the curved edge of the touch panel 200', and is electrically connected to at least one first sub-electrode 211 or second sub-electrode 221 adjacent to the curved edge. The centers of the orthographic projections of the connecting portions of the first touch electrode 210 where the seventh connecting portion 237' is located on the substrate are arranged on a straight line, and the centers of the orthographic projections of the connecting portions of the second touch electrode 220 where the seventh connecting portion 237' is located on the substrate are arranged on a straight line. In this case, the area of the first sub-electrode 211 or the second sub-electrode 221 adjacent to the curved edge is too small, so that there may be a problem of touch failure in proximity to the curved edge.

Compared with the related art shown in FIG. 4, the embodiment shown in FIG. 3 may be considered as moving the seventh connecting portion 237' away from the curved edge on the basis of the related art shown in FIG. 4. In this way, the area of the first sub-electrode 211 or the second sub-electrode 221 adjacent to the curved edge is increased, so that the problem of poor touch or touch failure at this position is avoided.

Those skilled in the art may understand that the touch panel in FIG. 5 to FIG. 7 may also include a curved edge area as shown in FIG. 3, which will not be repeated here.

Figure 10:
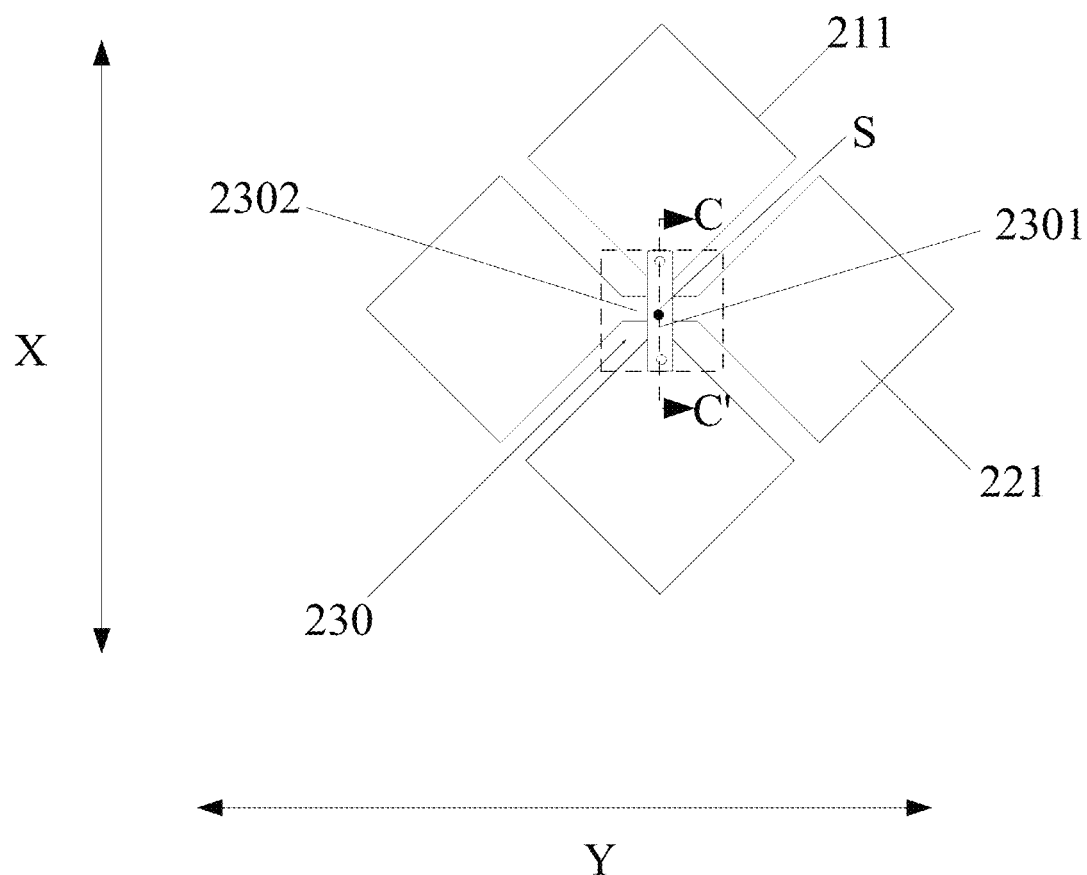
FIG. 10 shows a partial enlarged view of the touch panel in FIG. 3.

FIG. 10 is a schematic partial enlarged view of the touch panel in FIG. 3, showing a connecting portion as well as two first sub-electrodes and two second sub-electrodes that are adjacent to and electrically connected to the connecting portion. In describing the two first sub-electrodes and the two second sub-electrodes, two normal first sub-electrodes and two normal second sub-electrodes are illustrated by way of example.

As shown in FIG. 10, the connecting portion 230 includes a first connecting sub-portion 2301 and a second connecting sub-portion 2302. The first connecting sub-portion 2301 extends in the first direction X and electrically connects two first sub-electrodes 211 that are adjacent in the first direction X. The second connecting sub-portion 2302 extends in the second direction Y and electrically connects two second sub-electrodes 21 that are adjacent in the second direction Y. The first connecting sub-portion 2301 and the second connecting sub-portion 2302 are electrically insulated from one another. A first insulating layer 270 is provided between the first connecting sub-portion 2301 and the second connecting sub-portion 2302.

Figure 11:
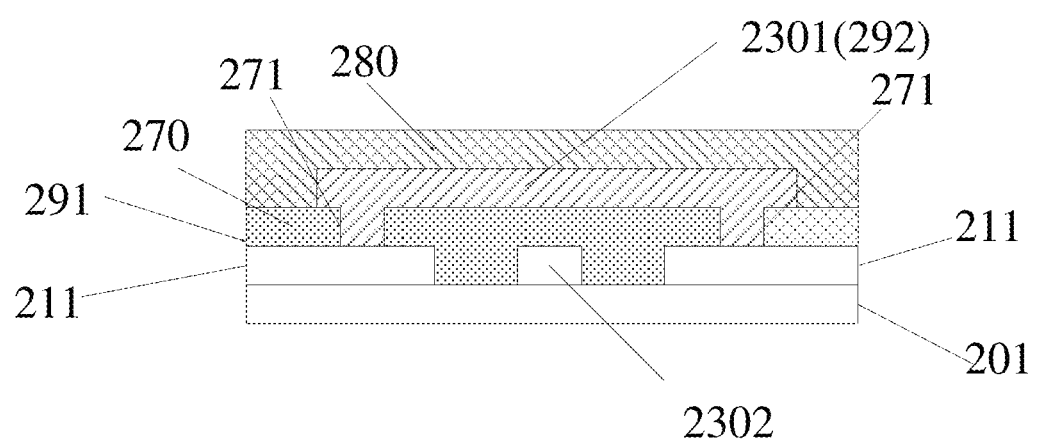
FIG. 11 shows a schematic cross-sectional view of the structure in FIG. 10, taken along line C-C'.

FIG. 11 shows a schematic cross-sectional view of the structure in FIG. 10, taken along line C-C'. As shown in FIG. 10 and FIG. 11, the first sub-electrode 211 and the second sub-electrode 221 are located in the same electrode layer which is denoted as a first electrode layer 291. The first electrode layer 291 is arranged on the substrate 201 and is made of a transparent conductive material such as ITO, IZO, etc. The second connecting sub-portion 2302 and the two second sub-electrodes 221 that are adjacent in the second direction Y may be formed as an integral structure. That is, the second connecting sub-portion 2302 is also located in the first electrode layer 291, and the second connecting sub-portion 2302 is arranged in the same layer as the first touch electrode 210 including the first sub-electrode 211 and the second touch electrode 220 including the second sub-electrode 221. The first connecting sub-portion 2301 is located in a second electrode layer 292. The second electrode layer 292 is located on a side of the first electrode layer 291 away from the substrate 201, and is made of, for example, a metal material. In addition, a first insulating layer 270 is provided between the first electrode layer 291 and the second electrode layer 292. A via hole 271 is provided in the first insulating layer 270. The first connecting sub-portion 2301 has one end electrically connected to one of the first sub-electrodes 211 through the via hole 271, and the other end electrically connected to the other of the first sub-electrodes 211 through the via hole 271, so that the two first sub-electrodes 11 are electrically connected by a bridge. As shown in FIG. 11, the touch panel 200 further includes a second insulating layer 280 located on a side of the second electrode layer 292 away from the substrate 201 so as to protect the first connecting sub-portion 2301.

Figure 12:
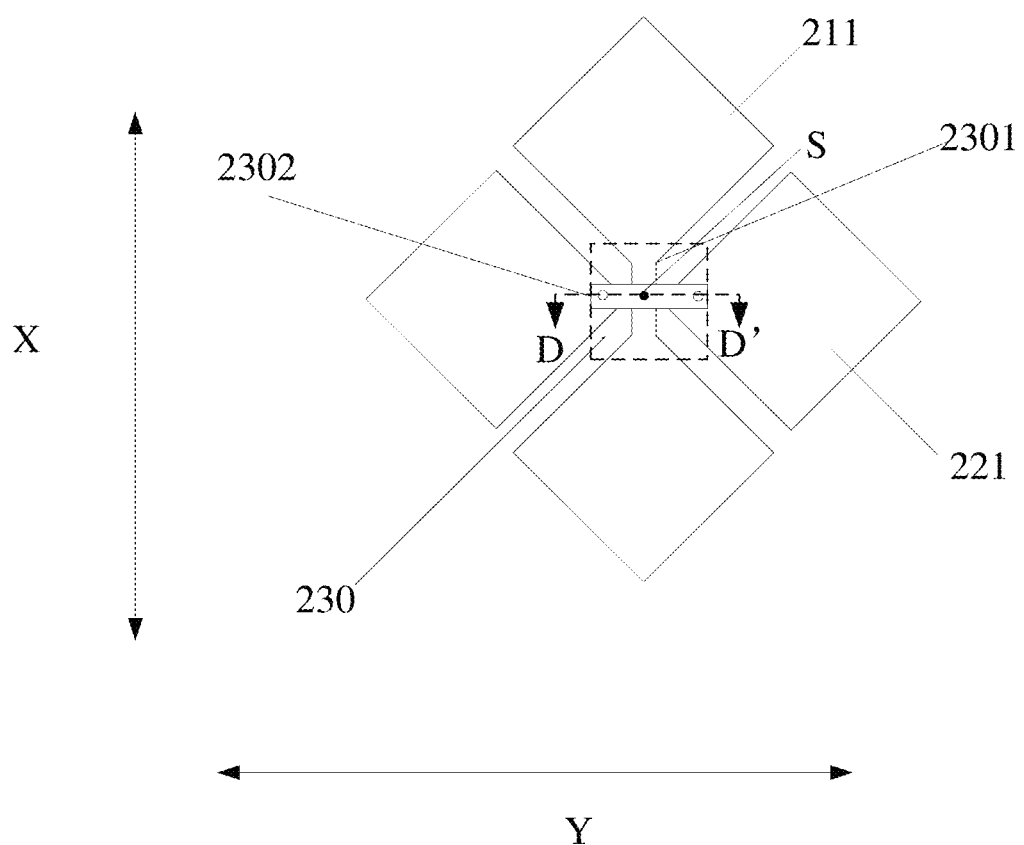
FIG. 12 shows a partial enlarged view of the touch panel in FIG. 3.

FIG. 12 is a schematic partial enlarged view of the touch panel in FIG. 3, showing a connecting portion as well as two first sub-electrodes and two second sub-electrodes that are adjacent to and electrically connected to the connecting portion. In describing the two first sub-electrodes and the two second sub-electrodes, two normal first sub-electrodes and two normal second sub-electrodes are illustrated by way of example.

As shown in FIG. 12, the connecting portion 230 includes a first connecting sub-portion 2301 and a second connecting sub-portion 2302. The first connecting sub-portion 2301 extends in the first direction X and electrically connects two first sub-electrodes 211 that are adjacent in the first direction X. The second connecting sub-portion 2302 extends in the second direction Y and electrically connects two second sub-electrodes 21 that are adjacent in the second direction Y. The first connecting sub-portion 2301 and the second connecting sub-portion 2302 are electrically insulated from one another. A first insulating layer 270 is provided between the first connecting sub-portion 2301 and the second connecting sub-portion 2302.

Figure 13:
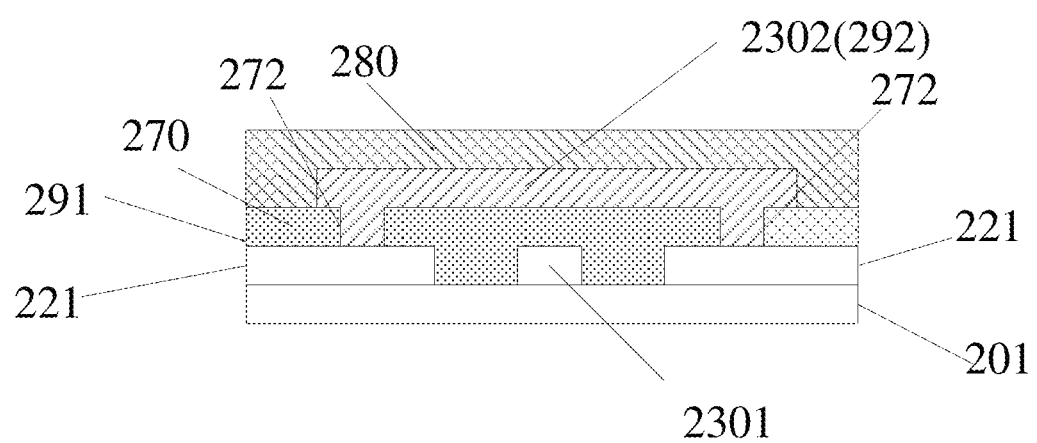
FIG. 13 shows a schematic cross-sectional view of the structure in FIG. 12, taken along line D-D'.

FIG. 13 shows a schematic cross-sectional view of the structure in FIG. 12, taken along line D-D'. As shown in FIG. 12 and FIG. 13, the first sub-electrode 211 and the second sub-electrode 221 are located in the same electrode layer denoted as a first electrode layer 291. The first electrode layer 291 is arranged on the substrate 201 and is made of a transparent conductive material such as ITO, IZO, etc. The first connecting sub-portion 2301 and the two first sub-electrodes 211 that are adjacent in the first direction X may be formed as an integral structure. That is, the first connecting sub-portion 2301 is also located in the first electrode layer 291, and the first connecting sub-portion 2301 is arranged in the same layer as the first touch electrode 210 including the first sub-electrode 211 and the second touch electrode 220 including the second sub-electrode 221. The second connecting sub-portion 2302 is located in the second electrode layer 292. The second electrode layer 292 is located on a side of the first electrode layer 291 away from the substrate 201, and is made of, for example, a metal material. In addition, an insulating layer 270 is provided between the first electrode layer 291 and the second electrode layer 292. A via hole 272 is provided in the insulating layer 270. The second connecting sub-portion 2302 has one end electrically connected to one of the second sub-electrodes 221 through the via hole 272, and the other end electrically connected to the other of the second sub-electrodes 221 through the via hole 272, so that the two second sub-electrodes 221 are electrically connected by a bridge. As shown in FIG. 11, the touch panel 200 further includes a second insulating layer 280 located on a side of the second electrode layer 292 away from the substrate 201 so as to protect the second connecting sub-portion 2302.

The connecting portion 230 mentioned herein refers to a portion in a dashed frame in FIG. 10 or FIG. 12, which includes a stacked structure of the first connecting sub-portion 2301 and the second connecting sub-portion 2302. A center of an orthographic projection of the connecting portion 230 on the substrate 100 is denoted by S in FIG. 10 or FIG. 12, that is, it is a center of the portion in the dashed frame in FIG. 10 or FIG. 12. A position of the center S may be used to indicate a position of the connecting portion 230. Those skilled in the art may understand that in FIG. 3 to FIG. 7, for the convenience of drawing, "+" is used to indicate the connecting portion 230, and a center of "+" is used to indicate the center S of the orthographic projection of the connecting portion 230 on the substrate 201.

In some embodiments, the connecting portion 230 may include one or more first connecting sub-portions 2301 and one or more second connecting sub-portions 2302. FIG. 10 and FIG. 12 only show examples in which the connecting portion 230 includes a first connecting sub-portion 2301 and a second connecting sub-portion 2302.

Figure 14:
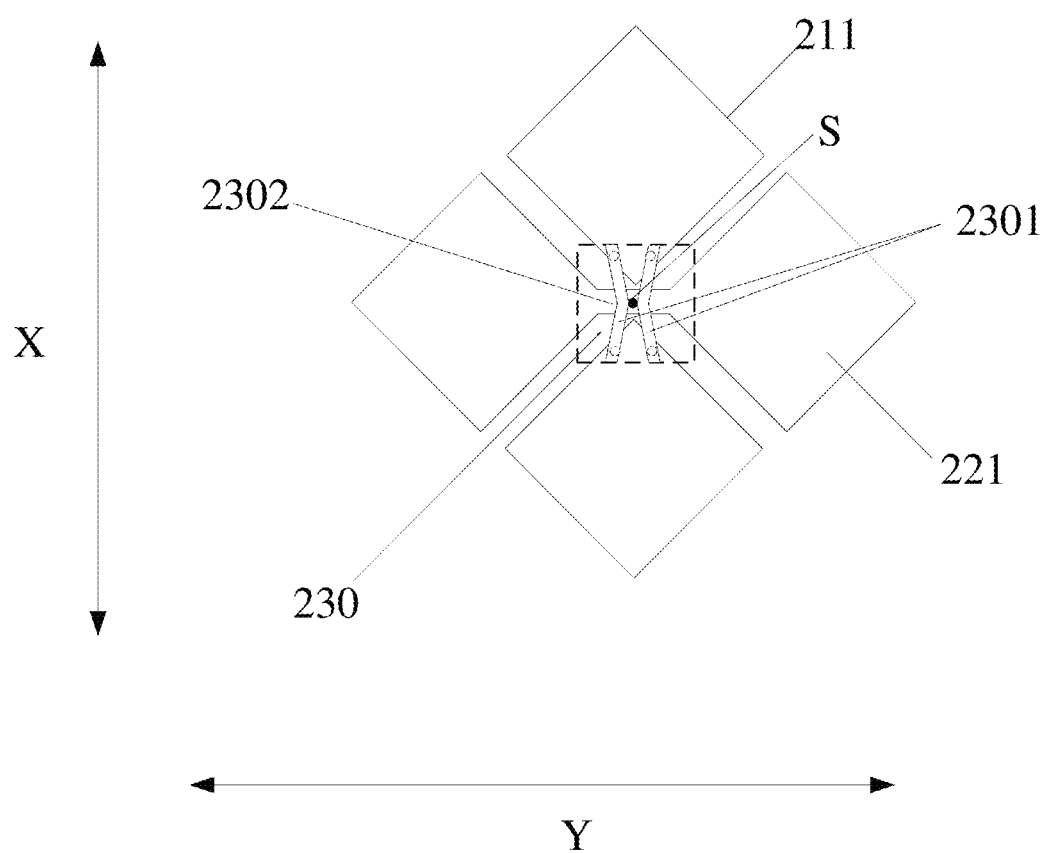
FIG. 14 shows a partial enlarged view of the touch panel in FIG. 3.

FIG. 14 shows a partial enlarged view of a touch panel according to some embodiments of the present disclosure. As shown in FIG. 14, the connecting portion 230 includes two first connecting sub-portions 2301 and a second connecting sub-portion 2302. Compared with the structure shown in FIG. 10, a first connecting sub-portion 2301 is added to the structure shown in FIG. 14. The layer where the first connecting sub-portions 2301 are located, the connection relationship between the first connecting sub-portions 2301 and two adjacent first sub-electrodes 11, and the connection mode thereof are basically the same as those shown in FIG. 6, which will not be repeated here.

Figure 17:
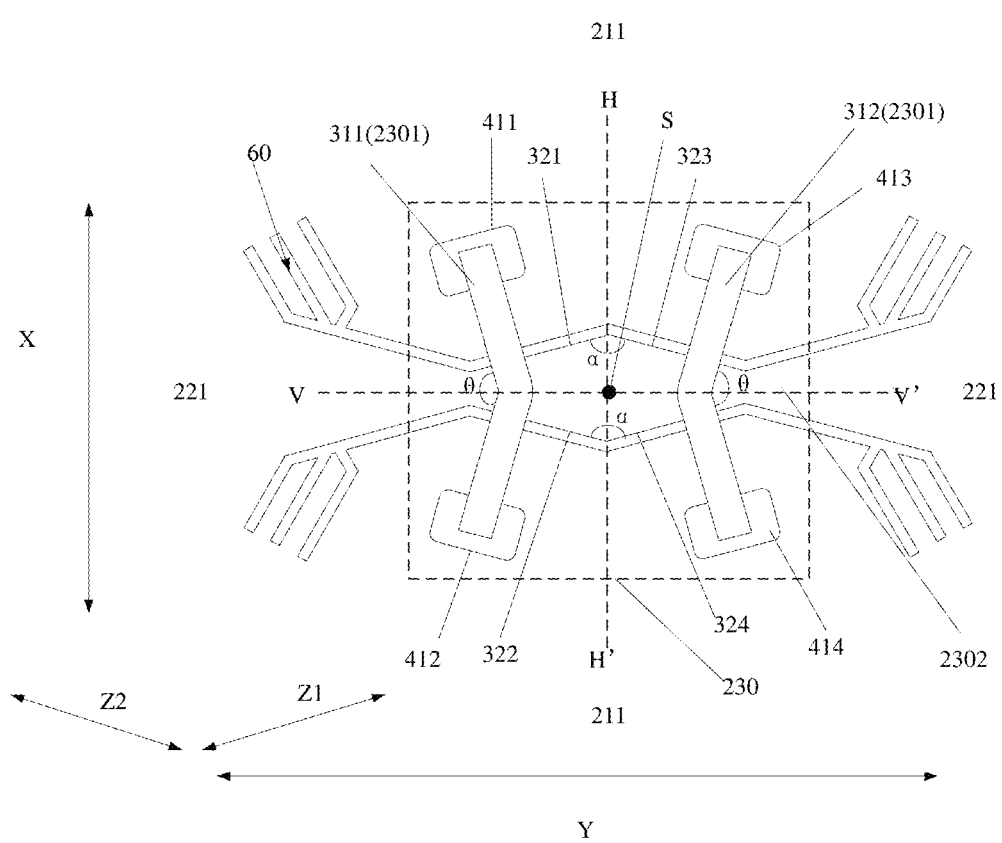
FIG. 17 shows a partial enlarged view of a touch panel according to some embodiments of the present disclosure.

In some embodiments, as shown in FIG. 14 and FIG. 17, the connecting portion 230 is a rectangle shown by a dashed frame. In some embodiments, a length of the connecting portion 230 in the second direction Y is greater than that in the first direction X. In some embodiments, a length of the connecting portion 230 in the second direction Y is less than or equal to that in the first direction X. In some embodiments, the length of the connecting portion 230 in the second direction Y is about 0.6 mm, and the length of the connecting portion 230 in the first direction X is 0.55 mm. In other embodiments, the length of the connecting portion 30 in the second direction Y is about 0.5 mm to 0.7 mm, and the length of the connecting portion 230 in the first direction X is about 0.45 mm to 0.65 mm. The "about" here refers to that a numerical boundary is not strictly limited, and a process and measurement error is allowed.

Those skilled in the art may understand that the first connecting sub-portion 2301 and/or the second connecting sub-portion 2302 may be straight strips (as shown in FIG. 10 and FIG. 12), bent strips (as shown in FIG. 14), curved strips, etc., which is not specifically limited here, as long as it may be ensured that the two first sub-electrodes or the two second sub-electrodes that are electrically connected thereto are electrically connected.

Those skilled in the art may understand that the above exemplary structure of the connecting portion 230 for connecting two normal first sub-electrodes and two normal second sub-electrodes as well as the connection relationship thereof are also applicable to the connecting portion for connecting abnormal first sub-electrodes and/or abnormal second sub-electrodes.

In the embodiments described above, the boundary between the first sub-electrode 211 and the second sub-electrode 221 that are adjacent to one another is a linear boundary. However, in some embodiments, the boundary between the first sub-electrode 211 and the second sub-electrode 211 that are adjacent to one another may have other shapes, such as a polygonal line shape. Hereinafter, a boundary between the first sub-electrode 211 denoted by 11 and the second sub-electrode 221 denoted by 25 in FIG. 7 is illustrated by way of example.

Figure 15:
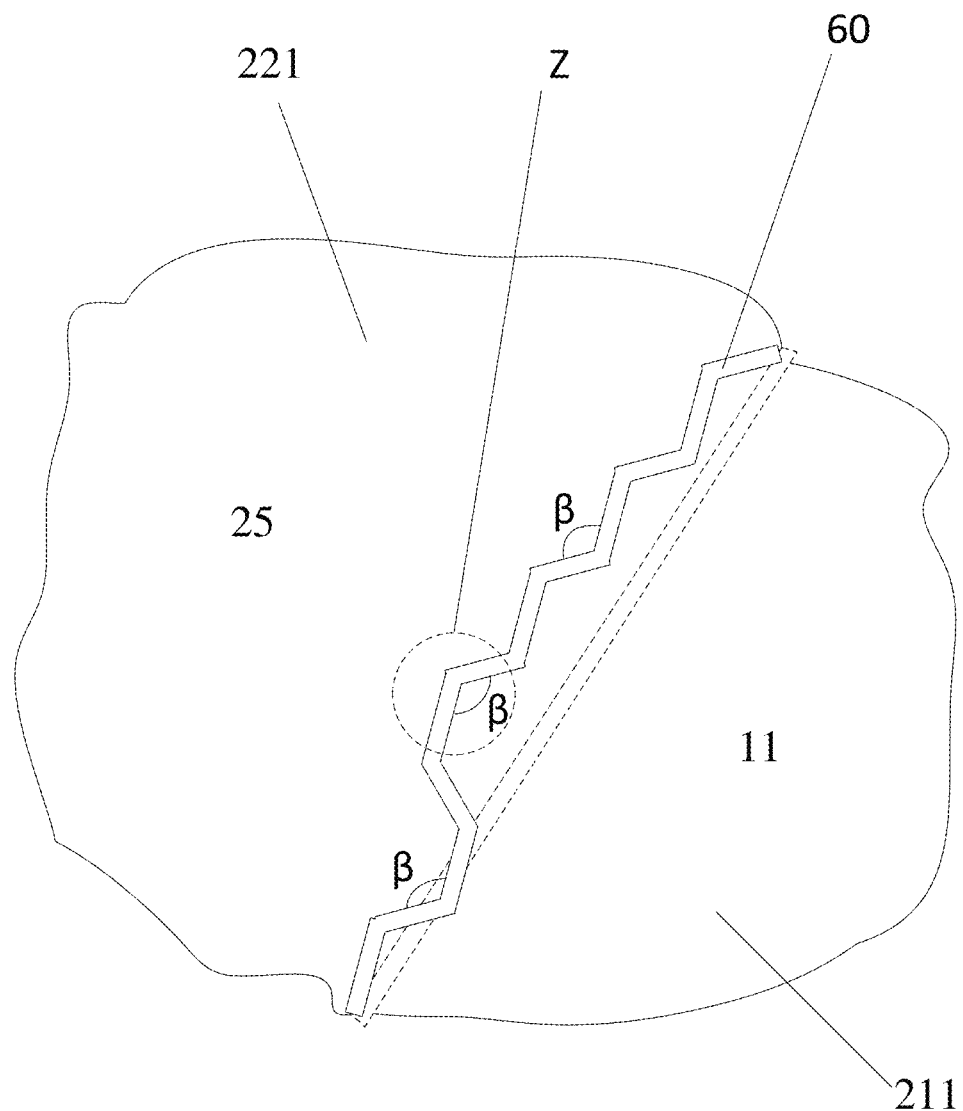
FIG. 15 shows a partial enlarged view of a touch panel according to some embodiments of the present disclosure.

FIG. 15 shows a schematic partial enlarged view of a touch panel according to some embodiments of the present disclosure, showing only a part of the first sub-electrode 211 denoted by 11 and the second sub-electrode 221 denoted by 25 as well as the boundary between the first sub-electrode 211 and the second sub-electrode 221. As shown in FIG. 15, a boundary 60 between the first sub-electrode 211 and the second sub-electrode 221 has a shape of a polygonal line. The boundary 60 includes a plurality of polygonal line segments connected end to end. Any two adjacent polygonal line segments are at an obtuse angle β of 120° to 140°. For example, the obtuse angle β between any two adjacent polygonal line segments is 130°. Compared with the case where the boundary between the first sub-electrode 211 and the second sub-electrode 221 is a straight line (shown by the dashed bar in FIG. 15), this arrangement may further adjust the size of the first sub-electrode 211 and the second sub-electrode 221 that are adjacent to one another. As shown in FIG. 7 and FIG. 15, a size of the first sub-electrode 211 denoted by 11 may be further increased, and a size of the second sub-electrode 221 denoted by 25 may be reduced, so that the sizes of the two sub-electrodes are further balanced. In some embodiments, the boundary 60 between the first sub-electrode 211 and the second sub-electrode 221 has a shape of a polygonal line. The boundary 60 includes a plurality of polygonal line segments connected end to end. Any two adjacent polygonal line segments are at an obtuse angle β of 120° to 140°, and at least two obtuse angles have different values.

Figure 16A:
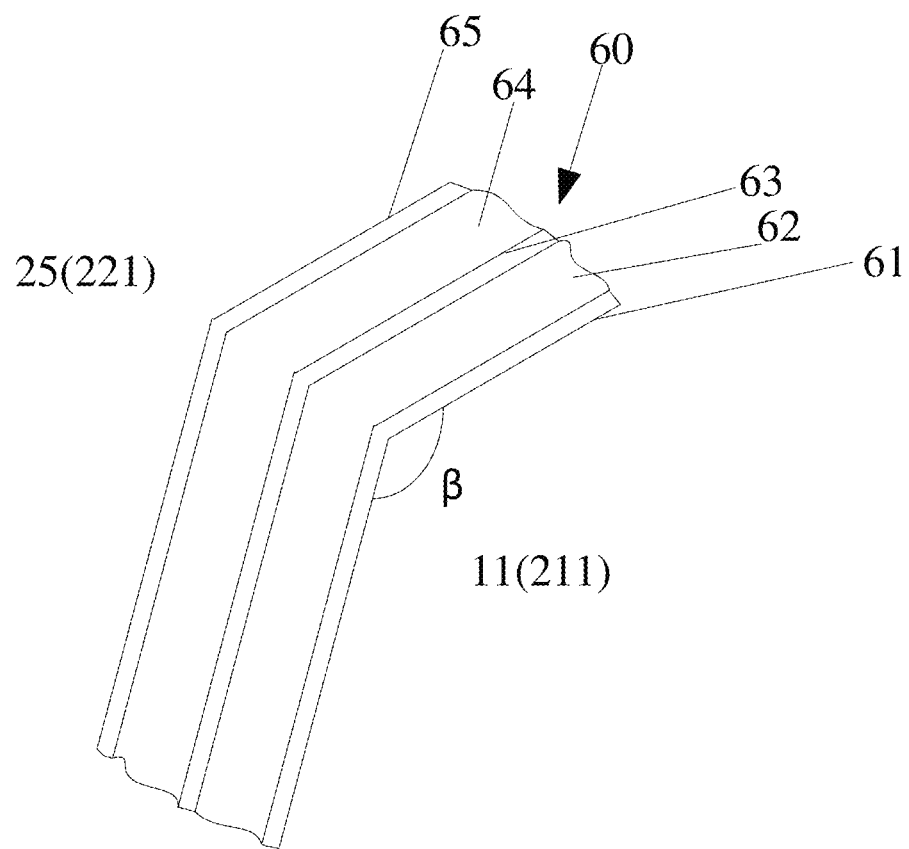
FIG. 16A shows a schematic enlarged view of an area Z in FIG. 15.

FIG. 16A shows a schematic enlarged view of an area Z in FIG. 15. As shown in FIG. 16A, the boundary 60 between the first sub-electrode 211 denoted by 11 and the second sub-electrode 221 denoted by 25 includes a first dummy electrode 62 and a second dummy electrode 64 that are located between the first sub-electrode 211 and the second sub-electrode 221. The first dummy electrode 62 and the second dummy electrode 64 both have a shape of a polygonal line, and they are arranged substantially in parallel. The fact that the dummy electrode 62 and the second dummy electrode 64 are arranged substantially in parallel means that the first dummy electrode 62 and the second dummy electrode 64 each include a plurality of polygonal line segments, and each polygonal line segment of the first dummy electrode 62 is arranged in parallel to a corresponding polygonal line segment of the second dummy electrode 64. Moreover, the first dummy electrode 62 is closer to the first sub-electrode 211 than the second dummy electrode 64, and the second dummy electrode 64 is closer to the second sub-electrode 221 than the first dummy electrode 62. The boundary 60 further includes a first gap 61 between the first sub-electrode 211 and the first dummy electrode 62, a second gap 63 between the first dummy electrode 62 and the second dummy electrode 64, and a third gap 65 between the second dummy electrode 64 and the second sub-electrode 221. The first gap 61 electrically insulates the first sub-electrode 211 from the first dummy electrode 62, the second gap 63 electrically insulates the first dummy electrode 62 from the second dummy electrode 64, and the third gap 65 electrically insulates the second dummy electrode 64 from the second sub-electrode 221. The first gap 61, the second gap 63 and the third gap 65 are all have a shape of a polygonal line and are arranged substantially in parallel.

In some embodiments, the first dummy electrode 62 and the second dummy electrode 64 are in a floating state.

In some embodiments, the first dummy electrode 62, the second dummy electrode 64, the first sub-electrode 211 and the second sub-electrode 221 are made of the same material and arranged in the same layer. With such an arrangement, a transmittance of an area where the first sub-electrode 211 and the second sub-electrode 221 are located may be as close as possible to that of an area where the boundary 60 is located, so that the transmittance of the entire touch panel is as uniform as possible.

Figure 16B:
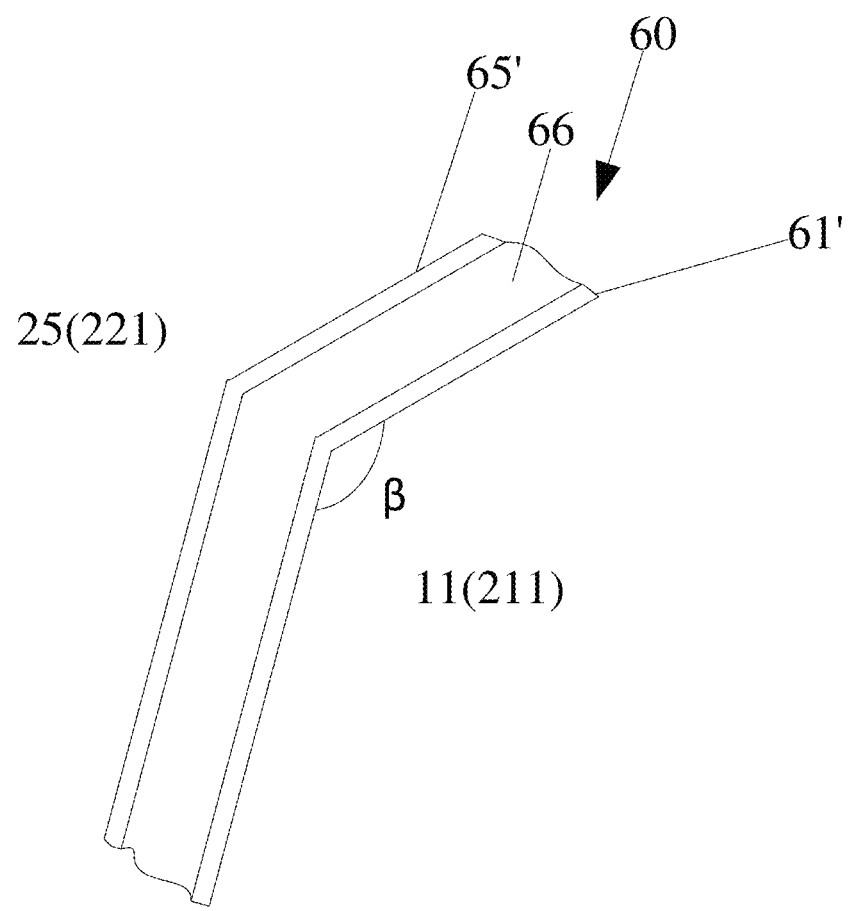
FIG. 16B shows a schematic enlarged view of an area Z in FIG. 15.

In some embodiments, FIG. 16B is a schematic enlarged view of the area Z in FIG. 15. The embodiment shown in FIG. 16B differs from the embodiment shown in FIG. 16A in that the boundary 60 between the first sub-electrode 211 denoted by 11 and the second sub-electrode 211 denoted by 25 only includes a dummy electrode 66. The dummy electrode 66 also includes a plurality of polygonal line segments. The boundary 60 further includes a first gap 61' between the first sub-electrode 211 and the dummy electrode 66, and a third gap 65' between the dummy electrode 66 and the second sub-electrode 221. The first gap 61' electrically insulates the first sub-electrode 211 from the dummy electrode 66, and the third gap 65' electrically insulates the dummy electrode 66 from the second sub-electrode 221. The first gap 61 and the third gap 65 both have a shape of a polygonal line and are arranged substantially in parallel. Compared with the embodiment shown in FIG. 16A, a dummy electrode and a gap are omitted in this embodiment, so that the area of the first sub-electrode 211 and the second sub-electrode 221 that are adjacent to one another may be larger, and the touch effect may be improved. Furthermore, a width of each gap in FIG. 16B may be smaller than a width of each gap in FIG. 16A, for example, it may be reduced by half In this case, the area of the adjacent first sub-electrode 211 and second sub-electrode 221 may be made larger, which improves the touch effect and helps shadow elimination.

Those skilled in the art may understand that a similar arrangement may be adopted for a boundary between any adjacent first sub-electrode 211 and second sub-electrode 221.

FIG. 17 shows a partial enlarged view of a touch panel according to some embodiments of the present disclosure, mainly showing a specific structure of a connecting portion 230 and a structure around the connecting portion 230. The connecting portion 230 is a part represented by a dashed frame in FIG. 17, which includes a stacked structure formed by a first connecting sub-portion 2301 and a second connecting sub-portion 2302, and which is a regular area where the stacked structure is located. Similar to the connecting portion 230 shown in FIG. 14, the connecting portion 230 in FIG. 17 includes two first connecting sub-portions 2301 (that is, a $1^{st}$ first connecting sub-portion 311 and a $2^{nd}$ first connecting sub-portion 312) and a second connecting sub-portion 2302, a first via hole 411 and a second via hole 412 respectively electrically connected to both ends of the $1^{st}$ first connecting sub-portion 311, and a third via hole 413 and a fourth via hole 414 respectively electrically connected to both ends of the $2^{nd}$ first connecting sub-portion 312. Here, the connecting portion may be a regular area (for example, having a rectangular shape or other shapes). The center of the orthographic projection of the connecting portion on the substrate may be a center of the orthographic projection of the regular area on the substrate.

As shown in FIG. 17, the connecting portion 230 connects an upper first sub-electrode 211 and a lower first sub-electrode 211, and the connecting portion 230 connects a left second sub-electrode 221 on a right second sub-electrode 221. The boundary 60 between any adjacent first sub-electrode 211 and second sub-electrode 221 has a shape of a polygonal line, similar to the boundary shown in FIG. 15. Only a portion of the boundary 60 close to the connecting portion 230 is shown in FIG. 17.

In some embodiments, in FIG. 17, the upper first sub-electrode 211, the lower first sub-electrode 211, the left second sub-electrode 221 and the right second sub-electrode 221 are made of the same material and arranged in the same layer. For example, similar to the embodiments shown in FIG. 10 and FIG. 11, they are all located in the first electrode layer 291. The second connecting sub-portion 2302 is formed integrally with the left second sub-electrode 221 and the right second sub-electrode 221. For example, it is also located in the first electrode layer 291. For example, similar to the embodiments shown in FIG. 10 and FIG. 11, the 1$^{st}$ first connecting sub-portion 311 and the 2$^{nd}$ first connecting sub-portion 312 are both located in the second electrode layer 292, and a first insulating layer 270 is provided between the first electrode layer 291 and the second electrode layer 292. The first insulating layer 270 is provided with a first via hole 411, a second via hole 412, a third via hole 413 and a fourth via hole 414. As shown in FIG. 17, the 1$^{st}$ first connecting sub-portion 311 has an upper end electrically connected to the upper first sub-electrode 211 through the first via hole 411, and a lower end electrically connected to the lower first sub-electrode 211 through the second via hole 412. The 2$^{nd}$ first connecting sub-portion 312 has an upper end electrically connected to the upper first sub-electrode 211 through the third via hole 413, and a lower end electrically connected to the lower first sub-electrode 211 through the fourth via hole 414.

In some embodiments, the first via hole 411, the second via hole 412, the third via hole 413 and the fourth via hole 414 have substantially the same shape and size. If process and measurement errors are excluded, the shapes and sizes of the first via hole 411, the second via hole 412, the third via hole 413 and the fourth via hole 414 are completely the same.

In some embodiments, as shown in FIG. 17, the 1$^{st}$ first connecting sub-portion 311 and the 2$^{nd}$ first connecting sub-portion 312 are both bent strips. Specifically, the 1$^{st}$ first connecting sub-portion 311 is bent toward the 2$^{nd}$ first connecting sub-portion 312, and the 2$^{nd}$ first connecting sub-portion 312 is bent toward the 1$^{st}$ first connecting sub-portion 311.

In some embodiments, as shown in FIG. 17, a bent portion of the 1$^{st}$ first connecting sub-portion 311 and a bent portion of the 2$^{nd}$ first connecting sub-portion 312 are both smoothly transitioned rounded corners, so as to avoid sharp corners in the bent portions.

In some embodiments, as shown in FIG. 17, a bending angle β formed by the 1$^{st}$ first connecting sub-portion 311 and the 2$^{nd}$ first connecting sub-portion 312 may be 130° to 150°, for example 140°.

In some embodiments, as shown in FIG. 17, the 1$^{st}$ first connecting sub-portion 311 and the 2$^{nd}$ first connecting sub-portion 312 are substantially mirror-symmetrical with respect to an axis H-H' of the connecting portion 230 parallel to the first direction X. An orthographic projection of a middle point of a straight line connecting a point of the 1$^{st}$ first connecting sub-portion 311 closest to the 2$^{nd}$ first connecting sub-portion 312 and a point of the 2$^{nd}$ first connecting sub-portion 312 closest to the 1$^{st}$ first connecting sub-portion 311 on the substrate is the center of the orthographic projection of the connecting portion 30 on the substrate.

In some embodiments, as shown in FIG. 17, the connecting portion 30 has an axisymmetric structure, which is symmetrical with respect to the axis H-H' parallel to the first direction X, and is symmetrical with respect to an axis V-V' parallel to the second direction Y.

In some embodiments, the second connecting sub-portion 2302 has a structure of a polygonal line, which is complementary to an edge shape of the first sub-electrode 211 not electrically connected to the second connecting sub-portion 2302. An angle α of the bent portion of the second connecting sub-portion 2302 protruding toward the upper first sub-electrode 211 and the angle α of the bent portion of the second connecting sub-portion 2302 protruding toward the lower first sub-electrode 211 may be 130° to 170°, for example 140°.

In some embodiments, a ratio of a maximum length of the first connecting sub-portion 2301 in the first direction X to a minimum length of the second connecting sub-portion 2302 in the first direction X is 2.75 to 3.25, for example, 3.

In some embodiments, an edge of the second connecting sub-portion 2302 includes a first polygonal line segment 321, a second polygonal line segment 322, a third polygonal line segment 323 and a fourth polygonal line segment 324. In some embodiments, the first polygonal line segment 321 is parallel to the fourth polygonal line segment 324 in a direction defined as a third direction Z1 that intersects each of the first direction X and the second direction Y In some embodiments, the second polygonal line segment 322 is parallel to the third polygonal line segment 323 in a direction defined as a fourth direction Z2 that intersects each of the first direction X, the second direction Y and the third direction Z1. An acute angle formed by the third direction Z1 and the second direction Y may be 5° to 25°, for example, 20°. An acute angle formed by the fourth direction Z2 and the second direction Y may be 5° to 25°, for example, 20°.

In some embodiments, as shown in FIG. 17, the 1$^{st}$ first connecting sub-portion 311 extends substantially in a direction perpendicular to the third direction Z1 toward the upper first sub-electrode 211, and extends substantially in a direction perpendicular to the fourth direction Z2 toward the lower first sub-electrode 211. The 2$^{nd}$ first connecting sub-portion 312 extends substantially in the direction perpendicular to the fourth direction Z1 toward the upper first sub-electrode 211, and extends substantially in the direction perpendicular to the third direction Z1 toward the lower first sub-electrode 211.

In some embodiments, the first via hole 411 is a rectangle, and a length direction of the first via hole 411 is parallel to the third direction Z1. In some embodiments, the first via hole 411 has a long side of about 0.18 mm and a short side of about 0.12 mm. In some embodiments, the first via hole 411 has a long side of about 0.15 mm to 0.2 mm and a short side of about 0.1 mm to 0.14 mm. In some embodiments, an end of a portion of the 1$^{st}$ first connecting sub-portion 311 that overlaps the first via hole is parallel to the third direction Z1, and has a length in the third direction Z1 smaller than the length of the first via hole 411. In some embodiments, a ratio of the length of the long side of the first via hole 411 to the length of the end of the portion of the 1$^{st}$ first connecting sub-portion 311 that overlaps the first via hole in the third direction Z1 is about 2.57. In some embodiments, the ratio of the length of the long side of the first via hole 411 to the length of the end of the portion of the 1$^{st}$ first connecting sub-portion 311 that overlaps the first via hole in the third direction Z1 is about 2-3. In some embodiments, the length of the end of the portion of the 1$^{st}$ first connecting sub-portion 311 that overlaps the first via hole in the third direction Z1 is about 0.07 mm. In some embodiments, the length of the end of the portion of the 1$^{st}$ first connecting sub-portion 311 that overlaps the first via hole in the third direction Z1 is about 0.04 mm to 0.1 mm.

In some embodiments, two sides of the 1$^{st}$ first connecting sub-portion 311 extending from the ends of the portion that overlaps the first via hole are parallel to the short sides of the first via hole 411. In addition, for these two sides, a length from the end to an inflection point of one side close to the $2^{nd}$ first connecting sub-portion 312 is greater than that from the end to an inflection point of the other side away from the $2^{nd}$ first connecting sub-portion 312. In some embodiments, the length from the end to the inflection point of the side close to the $2^{nd}$ first connecting sub-portion 312 is about 0.25 mm, and the length from the end to the inflection point of the side away from the $2^{nd}$ first connecting sub-portion 312 is about 0.23 mm. In some embodiments, the length from the end to the inflection point of the side close to the $2^{nd}$ first connecting sub-portion 312 is about 0.2 mm to 0.3 mm, and the length from the end to the inflection point of the side away from the $2^{nd}$ first connecting sub-portion 312 is about 0.2 mm to 0.25 mm.

In some embodiments, the second via hole 412 is a rectangle, and a length direction of the second via hole 412 is parallel to the fourth direction Z2. In some embodiments, the second via hole 412 has a long side of about 0.18 mm and a short side of about 0.12 mm. In some embodiments, the second via hole 412 has a long side of about 0.15 mm to 0.2 mm and a short side of about 0.1 mm to 0.14 mm. In some embodiments, an end of a portion of the $1^{st}$ first connecting sub-portion 311 that overlaps the second via hole is parallel to the fourth direction Z2, and has a length in the fourth direction Z2 smaller than the length of the second via hole 412. In some embodiments, a ratio of the length of the long side of the second via hole 412 to the length of the end of the portion of the $1^{st}$ first connecting sub-portion 311 that overlaps the second via hole in the fourth direction Z2 is about 2.57. In some embodiments, the ratio of the length of the long side of the second via hole 412 to the length of the end of the portion of the $1^{st}$ first connecting sub-portion 311 that overlaps the second via hole in the fourth direction Z2 is about 2-3. In some embodiments, the length of the end of the portion of the $1^{st}$ first connecting sub-portion 311 that overlaps the second via hole in the fourth direction Z2 is about 0.07 mm. In some embodiments, the length of the end of the portion of the $1^{st}$ first connecting sub-portion 311 that overlaps the second via hole in the fourth direction Z2 is about 0.04 mm to 0.1 mm.

In some embodiments, two sides of the $1^{st}$ first connecting sub-portion 311 extending from the ends of the portion that overlaps the second via hole are parallel to the short sides of the second via hole 412. In addition, for these two sides, a length from the end to an inflection point of one side close to the $2^{nd}$ first connecting sub-portion 312 is greater than that from the end to an inflection point of the other side away from the $2^{nd}$ first connecting sub-portion 312. In some embodiments, the length from the end to the inflection point of the side close to the $2^{nd}$ first connecting sub-portion 312 is about 0.25 mm, and the length from the end to the inflection point of the side away from the $2^{nd}$ first connecting sub-portion 312 is about 0.23 mm. In some embodiments, the length from the end to the inflection point of the side close to the $2^{nd}$ first connecting sub-portion 312 is about 0.2 mm to 0.3 mm, and the length from the end to the inflection point of the side away from the $2^{nd}$ first connecting sub-portion 312 is about 0.2 mm to 0.25 mm.

In some embodiments, the third via hole 413 is a rectangle, and a length direction of the third via hole 413 is parallel to the fourth direction Z2. In some embodiments, the third via hole 413 has a long side of about 0.18 mm, and a short side of about 0.12 mm. In some embodiments, the third via hole 413 has a long side of about 0.15 mm to 0.2 mm, and a short side of about 0.1 mm to 0.14 mm. In some embodiments, an end of a portion of the $2^{nd}$ first connecting sub-portion 312 that overlaps the third via hole is parallel to the fourth direction Z2, and has a length in the fourth direction Z2 smaller than the length of the third via hole 413. In some embodiments, a ratio of the length of the long side of the third via hole 413 to the length of the end of the portion of the $2^{nd}$ first connecting sub-portion 312 that overlaps the third via hole in the fourth direction Z2 is about 2.57. In some embodiments, the ratio of the length of the long side of the third via hole 413 to the length of the end of the portion of the $2^{nd}$ first connecting sub-portion 312 that overlaps the third via hole in the fourth direction Z2 is about 2-3. In some embodiments, the length of the end of the portion of the $2^{nd}$ first connecting sub-portion 312 that overlaps the third via hole in the fourth direction Z2 is about 0.07 mm. In some embodiments, the length of the end of the portion of the $2^{nd}$ first connecting sub-portion 312 that overlaps the third via hole in the fourth direction Z2 is about 0.04 mm to 0.1 mm.

In some embodiments, two sides of the $2^{nd}$ first connecting sub-portion 312 extending from the ends of the portion that overlaps the third via hole are parallel to the short sides of the third via hole 413. In addition, for these two sides, a length from the end to an inflection point of one side close to the $1^{st}$ first connecting sub-portion 311 is greater than that from the end to an inflection point of the other side away from the $1^{st}$ first connecting sub-portion 311. In some embodiments, the length from the end to the inflection point of the side close to the $1^{st}$ first connecting sub-portion 311 is about 0.25 mm, and the length from the end to the inflection point of the side away from the $1^{st}$ first connecting sub-portion 312 is about 0.23 mm. In some embodiments, the length from the end to the inflection point of the side close to the $1^{st}$ first connecting sub-portion 312 is about 0.2 mm to 0.3 mm, and the length from the end to the inflection point of the side away from the $1^{st}$ first connecting sub-portion 312 is about 0.2 mm to 0.25 mm.

In some embodiments, the fourth via hole 414 is a rectangle, and a length direction of the fourth via hole 414 is arranged parallel to the third direction Z1. In some embodiments, the fourth via hole 414 has a long side of about 0.18 mm and a short side of about 0.12 mm. In some embodiments, the fourth via hole 414 has a long side of about 0.15 mm to 0.2 mm and a short side of about 0.1 mm to 0.14 mm. In some embodiments, an end of a portion of the $2^{nd}$ first connecting sub-portion 312 that overlaps the fourth via hole is parallel to the third direction Z1, and has a length in the third direction Z1 smaller than the length of the fourth via hole 414. In some embodiments, a ratio of the length of the long side of the fourth via hole 414 to the length of the end of the portion of the $2^{nd}$ first connecting sub-portion 312 that overlaps the fourth via hole in the third direction Z1 is about 2.57. In some embodiments, the ratio of the length of the long side of the fourth via hole 414 to the length of the end of the portion of the $2^{nd}$ first connecting sub-portion 312 that overlaps the fourth via hole in the third direction Z1 is about 2-3. In some embodiments, the length of the end of the portion of the $2^{nd}$ first connecting sub-portion 312 that overlaps the fourth via hole in the third direction Z1 is about 0.07 mm. In some embodiments, the length of the end of the portion of the $2^{nd}$ first connecting sub-portion 312 that overlaps the fourth via hole in the third direction Z1 is about 0.04 mm to 0.1 mm.

In some embodiments, two sides of the $2^{nd}$ first connecting sub-portion 312 extending from the ends of the portion that overlaps the fourth via hole are parallel to the short sides of the fourth via hole 414. In addition, for these two sides, a length from the end to an inflection point of one side close to the $1^{st}$ first connecting sub-portion 311 is greater than that from the end to an inflection point of the other side away from the 1ˢᵗ first connecting sub-portion 311. In some embodiments, the length from the end to the inflection point of the side close to the 1ˢᵗ first connecting sub-portion 311 is about 0.25 mm, and the length from the end to the inflection point of the side away from the 1ˢᵗ first connecting sub-portion 312 is about 0.23 mm. In some embodiments, the length from the end to the inflection point of the side close to the 1ˢᵗ first connecting sub-portion 312 is about 0.2 mm to 0.3 mm, and the length from the end to the inflection point of the side away from the 1ˢᵗ first connecting sub-portion 312 is about 0.2 mm to 0.25 mm.

Those skilled in the art may understand that in the embodiments described above, rectangular first via hole, second via hole, third via hole and fourth via hole are illustrated by way of example. In other embodiments, the first via hole, the second via hole, the third via hole and the fourth via hole may also be square, diamond, circular, etc., which will not be repeated here.

Figure 18:
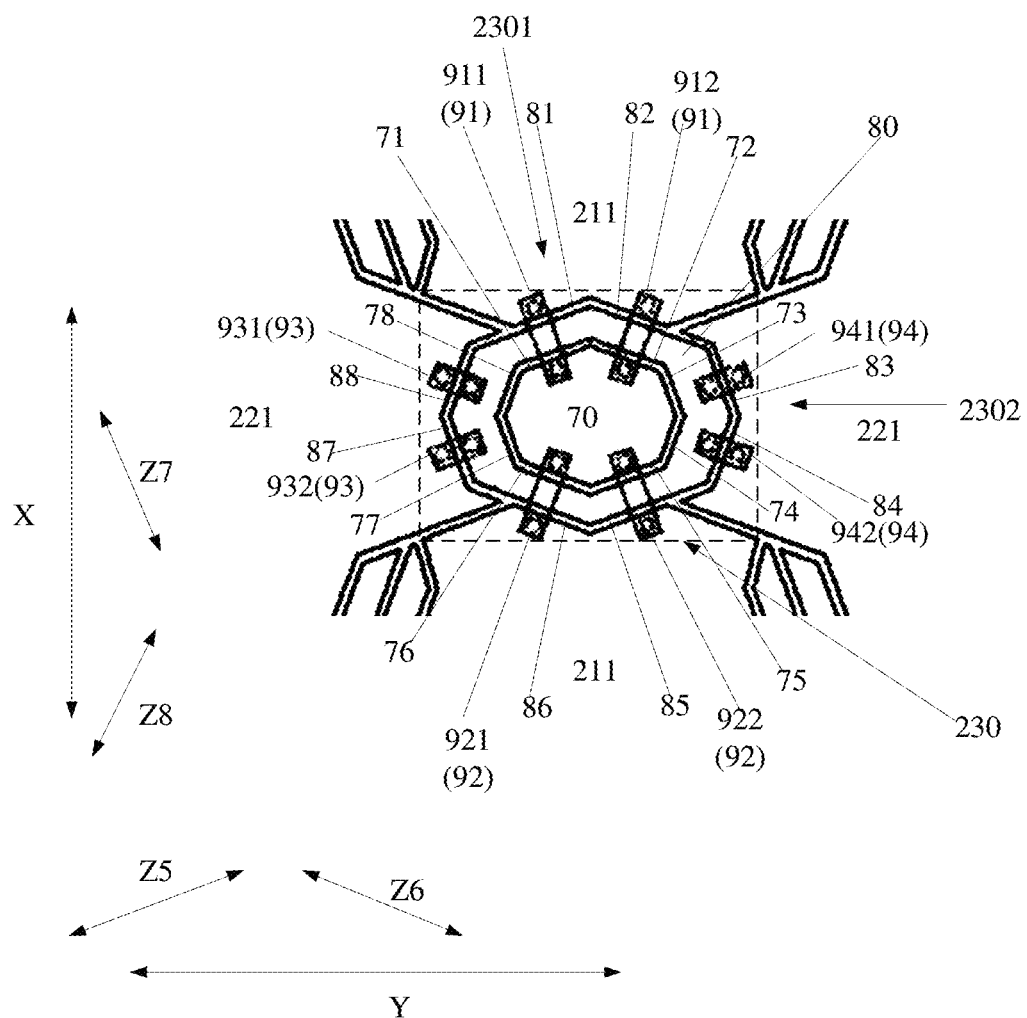
FIG. 18 shows a partial enlarged view of a touch panel according to some embodiments of the present disclosure.

In some embodiments, FIG. 18 shows a partial enlarged view of a touch panel according to some embodiments of the present disclosure, mainly showing a specific structure of a connecting portion 230 and a structure around the connecting portion 230. The connecting portion 230 is a part represented by a dashed frame in FIG. 18, which includes a stacked structure formed by a first connecting sub-portion 2301 and a second connecting sub-portion 2302, and which is a regular area where the stacked structure is located. As shown in FIG. 18, the connecting portion 230 electrically connects the upper first sub-electrode 211 and the lower first sub-electrode 211, and the connecting portion 230 also electrically connects the left second sub-electrode 221 and the right second sub-electrode 221.

As shown in FIG. 18, the connection portion 230 includes an intermediate connecting electrode 70 and an annular connecting electrode 80 surrounding the intermediate connecting electrode 70. The annular connecting electrode 80 is surrounded by the upper first sub-electrode 211, the lower first sub-electrode 211, the left second sub-electrode 221 and the right second sub-electrode 221. There is a gap between the intermediate connecting electrode 70 and the annular connecting electrode 80, so that the intermediate connecting electrode 70 and the annular connecting electrode 80 are insulated from one another. The gap has a width of, for example, 10 μm to 20 μm. There is also a gap between the annular connecting electrode 80 and each of the upper first sub-electrode 211, the lower first sub-electrode 211, the left second sub-electrode 221 and the right second sub-electrode 221. The gap has a width of, for example, 10 μm to 20 μm. The annular connecting electrode 80 is insulated from each of the upper first sub-electrode 211, the lower first sub-electrode 211, the left second sub-electrode 221 and the right second sub-electrode 221.

The connecting portion 230 further includes a first bridge electrode 91, a second bridge electrode 92, a third bridge electrode 93 and a fourth bridge electrode 94. The first bridge electrode 91 is, for example, a long strip, and electrically connects the intermediate connecting electrode 70 and the upper first sub-electrode 211. The second bridge electrode 92 is, for example, a long strip, and electrically connects the intermediate connecting electrode 70 and the lower first sub-electrode 211. The third bridge electrode 93 is, for example, a long strip, and electrically connects the intermediate connecting electrode 80 and the left second sub-electrode 221. The fourth bridge electrode 94 is, for example, a long strip, and electrically connects the intermediate connecting electrode 80 and the right second sub-electrode 221. The upper first sub-electrode 211 is electrically connected to the lower first sub-electrode 211 through the first bridge electrode 91, the intermediate connecting electrode 70 and the second bridge electrode 92. That is, the first bridge electrode 91, the intermediate connecting electrode 70 and the second bridge electrode 92 form the first connecting sub-portion 2301. The left second sub-electrode 221 is electrically connected to the right second sub-electrode 221 through the third bridge electrode 93, the annular connecting electrode 80 and the fourth bridge electrode 94. That is, the third bridge electrode 93, the annular connecting electrode 80 and the fourth bridge electrode 94 form the second connecting sub-portion 2302.

In some embodiments, the intermediate connecting electrode 70, the annular connecting electrode 80, the upper first sub-electrode 211, the lower first sub-electrode 211, the left second sub-electrode 221 and the right second sub-electrode 221 are made of the same material and arranged in the same layer. For example, they are formed of an ITO or IZO material by using the same patterning process.

In some embodiments, the first bridge electrode 91, the second bridge electrode 92, the third bridge electrode 93 and the fourth bridge electrode 94 are made of the same material and arranged in the same layer. For example, they are formed of the same metal material by using the same patterning process. In some embodiments, the metal material layer where the first bridge electrode 91, the second bridge electrode 92, the third bridge electrode 93 and the fourth bridge electrode 94 are located is located on a side of the ITO material layer, where the intermediate connecting electrode 70, the annular connecting electrode 80, the upper first sub-electrode 211, the lower first sub-electrode 211, the left second sub-electrode 221 and the right second sub-electrode 221 are located, away from the substrate. An insulating layer is provided between the metal material layer and the ITO material layer.

As shown in FIG. 18, there may be one or more first bridge electrodes 91. For example, the first bridge electrode 91 includes a 1ˢᵗ first bridge electrode 911 and a 2ⁿᵈ first bridge electrode 912. The 1ˢᵗ first bridge electrode 911 and the 2ⁿᵈ first bridge electrode 912 are both strip-shaped electrodes, and both are electrically connected to the intermediate connecting electrode 70 and the upper first sub-electrode 211. In some embodiments, the 1ˢᵗ first bridge electrode 911 and the 2ⁿᵈ first bridge electrode 912 gradually converge from the upper first sub-electrode 211 toward the intermediate connecting electrode 70. There may be one or more second bridge electrodes 92. For example, the second bridge electrode 92 includes a 1ˢᵗ second bridge electrode 921 and a 2ⁿᵈ second bridge electrode 922. The 1ˢᵗ second bridge electrode 921 and the 2ⁿᵈ second bridge electrode 922 are strip-shaped electrodes, and both are electrically connected to the intermediate connecting electrode 70 and the lower first sub-electrode 211. In some embodiments, the 1ˢᵗ second bridge electrode 921 and the 2ⁿᵈ second bridge electrode 922 gradually converge from the lower first sub-electrode 211 toward the intermediate connecting electrode 70. There may be one or more third bridge electrodes 93. For example, the third bridge electrode 93 includes a 1ˢᵗ third bridge electrode 931 and a 2ⁿᵈ third bridge electrode 932. The 1ˢᵗ third bridge electrode 931 and the 2ⁿᵈ third bridge electrode 932 are strip-shaped electrodes, and both are electrically connected to the annular connecting electrode 80 and the left second sub-electrode 221. In some embodiments, the 1ˢᵗ third bridge electrode 931 and the 2ⁿᵈ third bridge electrode 932 gradually converge from the left second sub-electrode 221 toward the intermediate connecting electrode 70. There may be one or more fourth bridge electrodes 94. For example, the fourth bridge electrode 94 includes a $1^{st}$ fourth bridge electrode 941 and a $2^{nd}$ fourth bridge electrode 942. The $1^{st}$ fourth bridge electrode 941 and the $2^{nd}$ fourth bridge electrode 942 are strip-shaped electrodes, and both are electrically connected to the annular connecting electrode 80 and the right second sub-electrode 221. In some embodiments, the $1^{st}$ fourth bridge electrode 941 and the $2^{nd}$ fourth bridge electrode 942 gradually converge from the right second sub-electrode 221 toward the intermediate connecting electrode 70.

In some embodiments, as shown in FIG. 18, the intermediate connecting electrode 70 is, for example, a symmetrical octagon, and has an edge including a first polygonal line segment 71, a second polygonal line segment 72, a third polygonal line segment 73, a fourth polygonal line segment 74, a fifth polygonal line segment 75, a sixth polygonal line segment 76, a seventh polygonal line segment 77 and an eighth polygonal line segment 78 that are connected end to end in sequence. The first polygonal line segment 71 and the fifth polygonal line segment 75 extend in a fifth direction Z5, the second polygonal line segment 72 and the sixth polygonal line segment 76 extend in a sixth direction Z6, the third polygonal line segment 73 and the seventh polygonal line segment 77 extend in a seventh direction Z7, and the fourth polygonal line segment 74 and the eighth polygonal line segment 78 extend in an eighth direction Z8. Each of the fifth direction Z5, the sixth direction Z6, the seventh direction Z7 and the eighth direction Z8 intersects each of the first direction X and the second direction Y. Any two of the fifth direction Z5, the sixth direction Z6, the seventh direction Z7 and the eighth direction Z8 intersect one another.

In some embodiments, as shown in FIG. 18, an inner edge of the annular connecting electrode 80 close to the intermediate connecting electrode 70 matches the edge of the intermediate connecting electrode 70 in shape, and an edge of the annular connecting electrode 80 away from the intermediate connecting electrode 70 includes a first polygonal line portion 81, a second polygonal line portion 82, a third polygonal line portion 83, a fourth polygonal line portion 84, a fifth polygonal line portion 85, a sixth polygonal line portion 86, a seventh polygonal line portion 87 and an eighth polygonal line portion 88 that are connected end to end in sequence. The first polygonal line portion 81, the second polygonal line portion 82, the third polygonal line portion 83, the fourth polygonal line portion 84, the fifth polygonal line portion 85, the sixth polygonal line portion 86, the seventh polygonal line portion 87 and the eighth polygonal line portion 88 are arranged parallel to and correspond to the first polygonal line segment 71, the second polygonal line segment 72, the third polygonal line segment 73, the fourth polygonal line segment 74, the fifth polygonal line segment 75, the sixth polygonal line segment 76, the seventh polygonal line segment 77 and the eighth polygonal line segment 78 of the intermediate connecting electrode 70, respectively.

In some embodiments, as shown in FIG. 18, the $1^{st}$ first bridge electrode 911 extends across the first polygonal line segment 71 and the first polygonal line portion 81 to electrically connect the upper first sub-electrode 211 and the intermediate connecting electrode 70. The $2^{nd}$ first bridge electrode 912 extends across the second polygonal line segment 72 and the second polygonal line portion 82 to electrically connect the upper first sub-electrode 211 and the intermediate connecting electrode 70. The $1^{st}$ second bridge electrode 921 extends across the sixth polygonal line segment 76 and the sixth polygonal line portion 86 to electrically connect the lower first sub-electrode 211 and the intermediate connecting electrode 70. The $2^{nd}$ second bridge electrode 922 extends across the fifth polygonal line segment 75 and the fifth polygonal line portion 85 to electrically connect the lower first sub-electrode 211 and the intermediate connecting electrode 70. The $1^{st}$ third bridge electrode 931 extends across the eighth polygonal line portion 88 to electrically connect the left second sub-electrode 221 and the annular connecting electrode 80. The $2^{nd}$ third bridge electrode 932 extends across the seventh polygonal line portion 87 to electrically connect the left second sub-electrode 221 and the annular connecting electrode 80. The $1^{st}$ fourth bridge electrode 941 extends across the third polygonal line portion 83 to electrically connect the right second sub-electrode 221 and the annular connecting electrode 80. The $2^{nd}$ fourth bridge electrode 942 extends across the fourth polygonal line portion 84 to electrically connect the right second sub-electrode 221 and the annular connecting electrode 80.

In some embodiments, the $1^{st}$ first bridge electrode 911 is perpendicular to the first polygonal line segment 71, the $2^{nd}$ first bridge electrode 912 is perpendicular to the second polygonal line segment 72, the $1^{st}$ second bridge electrode 921 is perpendicular to the sixth polygonal line segment 76, the $2^{nd}$ second bridge electrode 922 is perpendicular to the fifth polygonal line segment 75, the $1^{st}$ third bridge electrode 931 is perpendicular to the eighth polygonal line portion 88, the $2^{nd}$ third bridge electrode 932 is perpendicular to the seventh polygonal line portion 87, the $1^{st}$ fourth bridge electrode 941 is perpendicular to the third polygonal line portion 83, and the $2^{nd}$ fourth bridge electrode 942 is perpendicular to the fourth polygonal line portion 84.

In some embodiments, for each of the $1^{st}$ first bridge electrode 911, the $2^{nd}$ first bridge electrode 912, the $1^{st}$ second bridge electrode 921, the $2^{nd}$ second bridge electrode 922, the $1^{st}$ third bridge electrode 931, the $2^{nd}$ second bridge electrode 932, the $1^{st}$ fourth bridge electrode 941 and the $2^{nd}$ fourth bridge electrode 942, a bridge function is achieved through via holes located at both ends thereof. Specifically, taking the $1^{st}$ first bridge electrode 911 as an example, the $1^{st}$ first bridge electrode 911 is electrically connected to the upper first sub-electrode 211 through a via hole at one end thereof, and is electrically connected to the intermediate connecting electrode 70 through a via hole at the other end thereof, so that a bridge between the upper first sub-electrode 211 and the intermediate connecting electrode 70 is achieved.

In some embodiments, the via hole may have a conventional shape such as a circle, a square or a rectangle. For example, the via hole is a square and has a side length of 20 μm to 40 μm, for example, 30 μm.

In some embodiments, each of the $1^{st}$ first bridge electrode 911, the $2^{nd}$ first bridge electrode 912, the $1^{st}$ second bridge electrode 921 and the $2^{nd}$ second bridge electrode 922 may have an elongated shape, with a length of 200 μm to 250 μm, for example, 225 μm, and with a width of 40 μm to 70 μm, for example, 54 μm.

In some embodiments, each of the $1^{st}$ third bridge electrode 931, the $2^{nd}$ third bridge electrode 932, the $1^{st}$ fourth bridge electrode 941 and the $2^{nd}$ fourth bridge electrode 942 may have an elongated shape, with a length of 100 μm to 150 μm, for example, 128 μm, and with a width of 40 μm to 70 μm, for example, 54 μm.

The specific structure of the display panel 100 is explained in detail below. The display panel 100 may be, for example, an OLED display panel. Referring to FIG. 2, the display panel 100 includes an opening area HA and an effective display area DA surrounding the opening area HA.

Specifically, in the effective display area DA, the display panel 100 may include a base substrate, a driving circuit layer and a display device.

The base substrate may be a flexible substrate to improve the flexibility of the display panel 100, so that the display panel 100 may have properties such as bendability, so as to expand an application range of the display panel 100. However, the present disclosure is not limited thereto. The base substrate may also be rigid, and the specific performance of the base substrate may be determined according to actual requirements of a product.

Figure 19:
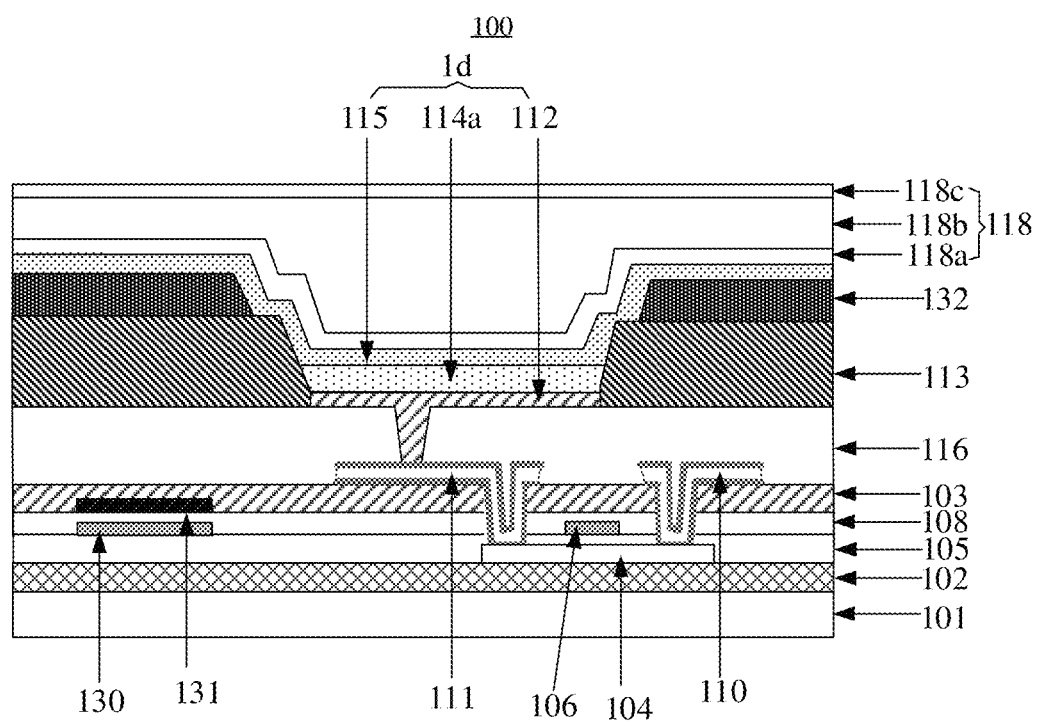
FIG. 19 shows a schematic cross-sectional view of a display panel according to some embodiments of the present disclosure.

FIG. 19 shows a schematic cross-sectional view of a display panel according to some embodiments of the present disclosure. FIG. 19 only shows a partial cross-sectional structure of the effective display area DA of the display panel. The base substrate may have a single-layer structure or a multi-layer structure. For example, as shown in FIG. 19, the base substrate may include a polyimide layer 101 and a buffer layer 102 stacked in sequence. In other embodiments, the base substrate may include a plurality of polyimide layers and buffers layer 102 stacked in sequence. The buffer layer 102 may be made of a material such as silicon nitride, silicon oxide, etc., to achieve effects of blocking water and oxygen and blocking alkaline ions. It should be noted that the structure of the base substrate is not limited thereto and may be determined according to actual requirements.

The driving circuit layer may be formed on the base substrate. For example, as shown in FIG. 19, the driving circuit layer may be formed on the buffer layer 102. The driving circuit layer may further include an interlayer dielectric layer 103, which is made of an inorganic material such as silicon oxide, silicon nitride, etc., so as to achieve effects of blocking water and oxygen and blocking alkaline ions.

The driving circuit layer may further include a thin film transistor and a capacitor structure, which are described below in detail.

As shown in FIG. 19, the thin film transistor may be of a top gate type. The thin film transistor may include an active layer 104, a first gate insulating layer 105, a gate electrode 106, a second gate insulating layer 108, an interlayer dielectric layer 103, a source electrode 110 and a drain electrode 111. Specifically, the active layer 104 may be formed on the buffer layer 102. The first gate insulating layer 105 covers the buffer layer 102 and the active layer 104. The gate electrode 106 is formed on a side of the first gate insulating layer 105 away from the active layer 104. The second gate insulating layer 108 covers the gate electrode 106 and the first gate insulating layer 105. The interlayer dielectric layer 103 covers the second gate insulating layer 108. The source electrode 110 and the drain electrode 111 are formed on a side of the interlayer dielectric layer 103 away from the base substrate and located on opposite sides of the gate electrode 106. The source electrode 110 and the drain electrode 111 may contact opposite sides of the active layer 104 respectively through via holes (for example, metal via holes). It should be understood that the thin film transistor may also be of a bottom gate type.

As shown in FIG. 19, the capacitor structure may include a first polar plate 130 and a second polar plate 131. The first polar plate 130 is arranged in the same layer as the gate electrode 106. The second polar plate 131 is located between the second gate insulating layer 108 and the interlayer dielectric layer 103 and arranged opposite to the first polar plate 130.

For example, the gate electrode 106, the first polar plate 130 and the second polar plate 131 may contain metal materials or alloy materials, such as molybdenum, aluminum and titanium. The source electrode 110 and the drain electrode 111 may include a metal single-layer or multi-layer structure formed by a metal material or an alloy material such as molybdenum, aluminum, titanium, etc. For example, the multi-layer structure is a multi-metal stacked layer, such as Al/Ti/Al stacked layer or the like.

As shown in FIG. 19, the display device located in the effective display area TA may include a first electrode 112 and a pixel defining portion 113 sequentially formed on the interlayer dielectric layer 103. It should be understood that the display device may further include a light emitting portion 114a and a second electrode 115.

In detail, when the thin film transistor is of the top gate type, a planarization layer 116 may be formed prior to the display device is manufactured. The planarization layer may have a single-layer structure or a multi-layer structure. The planarization layer is generally made of an organic material, such as photoresist, acrylic-based polymer, silicon-based polymer, etc. As shown in FIG. 19, the planarization layer 116 is formed between the interlayer dielectric layer 103 and the first electrode 112. The first electrode 112 may be electrically connected to the drain electrode 111 through a metal via hole. The first electrode 112 may be an anode electrode, which may be made of Indium Tin Oxide (ITO), Indium Zinc Oxide (IZO), Zinc Oxide (ZnO) or other materials. A pixel defining portion 113 may cover the planarization portion 116. The pixel defining portion 113 may be made of an organic material such as photoresist. A portion of the pixel defining portion 113 located in the display area 10a may include a pixel opening exposing the first electrode 112. A light emitting portion 114a is located in the pixel opening and is formed on the first electrode 112. The light emitting portion 114a may contain small molecular organic materials or polymer molecular organic materials, and may be fluorescent luminescent material or phosphorescent luminescent material. It may emit red light, green light, blue light, or white light, etc. Moreover, according to different actual needs, in different examples, the light emitting portion 114a may further include functional layers such as an electron injection layer, an electron transport layer, a hole injection layer, and a hole transport layer. The second electrode 115 covers the light emitting portion 114a, and the second electrode 115 has a polarity opposite to that of the first electrode 112. The second electrode 115 may be a cathode electrode, which may be made of a metal material such as lithium (Li), aluminum (Al), magnesium (Mg), silver (Ag), etc.

It should be noted that as shown in FIG. 19, the first electrode 112, the light emitting portion 114a and the second electrode 115 may form a light emitting sub-pixel 1d. The display device located in the effective display area DA may include a plurality of light emitting sub-pixels 1d arranged in an array. In addition, it should be noted that the first electrodes 112 of the light emitting sub-pixels 1d are independent of one another, and the second electrodes 115 of the light emitting sub-pixels 1d are connected over the entire surface. That is, the second electrode 115 is an entire-surface structure provided on the display substrate 100, and is a common electrode for a plurality of display devices.

In some embodiments, as shown in FIG. 19, a support portion 132 may be provided on a side of the pixel defining portion 113 away from the interlayer dielectric layer 103. The support portion 132 may function to support a protective film layer, so as to prevent damage to the first electrode 112 or other wires caused by a contact of the protective film layer with the first electrode 112 or the other wires. It should be noted that the protective film layer is mainly present during a transfer of a semi-finished product so as to avoid damage to the semi-finished product during the transfer. Specifically, in the process of transferring the substrate on which the support portion 132 has been manufactured to an evaporation production line, it may be covered with a protective film layer, and the protective film layer may be removed when the evaporation of a luminescent material is required.

For example, the support portion 132 may be made of the same material as the pixel defining portion 113, and may be formed by the same patterning process as the pixel defining portion 113. However, the present disclosure is not limited to this. The support portion 132 may also be made of a different material from the pixel defining portion 113, and may be formed by a different patterning process from the pixel defining portion 113.

Figure 20:
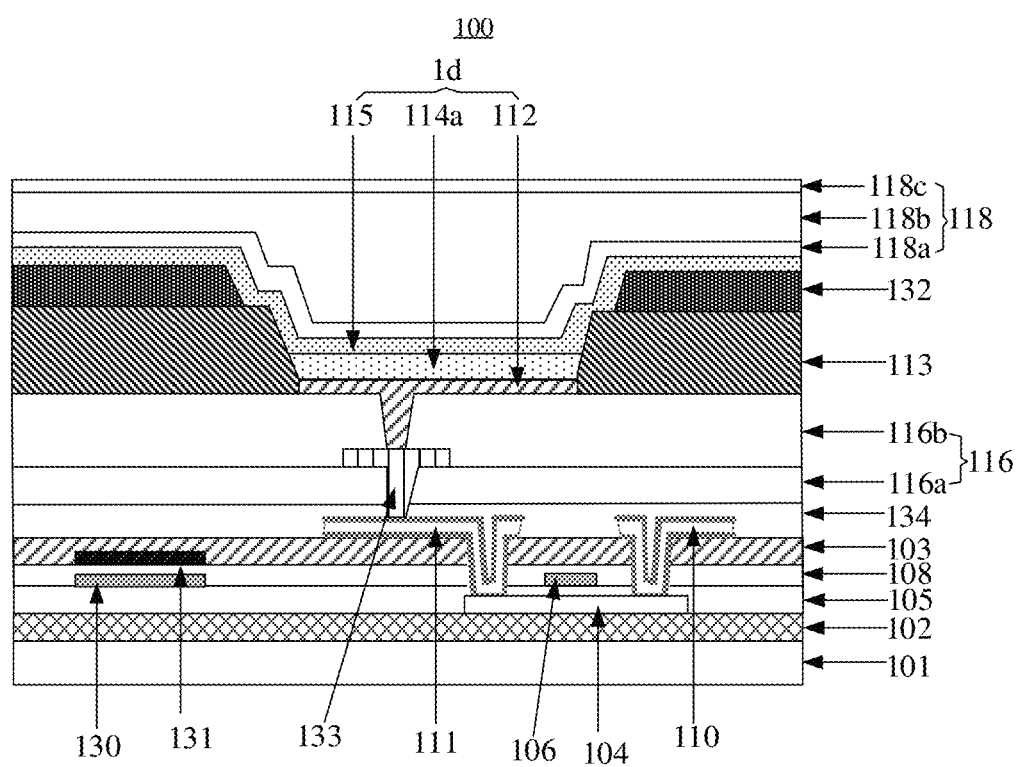
FIG. 20 shows a schematic cross-sectional view of a display panel according to some embodiments of the present disclosure.

FIG. 20 shows a schematic diagram of a cross-sectional structure of a display panel according to some embodiments of the present disclosure. The cross-sectional structure shown in FIG. 20 is substantially the same as that shown in FIG. 19. In some embodiments, as shown in FIG. 20, the first electrode 112 may also be electrically connected to the drain electrode 111 through a transfer electrode 133. When the first electrode 112 is electrically connected to the drain electrode 111 through the transfer electrode 133, the planarization layer 116 may have a double-layer structure, which may specifically include a first planarization film (PLN1) layer 116a and a second planarization film (PLN2) layer 116b formed in sequence. In addition, a passivation film (PVX) layer 134 may be formed between the first planarization film layer 116a and the interlayer dielectric layer 103. The passivation film layer 134 may be made of silicon oxide, silicon nitride or silicon oxynitride. The passivation film 134 covers the source electrode 110 and the drain electrode 111. It should be noted that when the planarization layer 116 is a single layer, the passivation film 134 may also be formed between the planarization layer 116 and the interlayer dielectric layer 103. The transfer electrode 133 is formed between the first planarization film layer 116a and the second planarization film layer 116b, and is electrically connected to the drain electrode 111 sequentially through the via holes (such as metal via holes) in the first planarization film layer 116a and in the passivation film layer 134. The first electrode 112 may be electrically connected to the transfer electrode 133 through a via hole (for example, a metal via hole) in the second planarization film layer 116b, as shown in FIG. 20. However, the present disclosure is not limited thereto. The transfer electrode 133 may also be formed between the first planarization film layer 116a and the passivation film layer 134.

In some embodiments, as shown in FIG. 19 and FIG. 20, the display panel 100 further includes a packaging layer 118. The packaging layer 118 may include a first inorganic packaging film layer 118a, an organic packaging film layer 118b and a second inorganic packaging layer 118c stacked in sequence. The packaging layer 118 is used to package the display device in the effective display area TA so as to prevent water and oxygen from entering and corroding the display device. The first inorganic packaging film layer 118a and the second inorganic packaging film layer 118c may be made of inorganic materials such as silicon nitride, silicon oxide, etc. The organic packaging film layer 118b is used to achieve planarization so as to facilitate the production of the second inorganic packaging film layer 118c. The organic packaging film layer 118b may be made of acrylic-based polymer, silicon-based polymer, or other materials.

The first inorganic packaging film layer 118a and the second inorganic packaging film layer 118c may be formed by a chemical vapor deposition process. However, the present disclosure is not limited thereto. A physical vapor deposition process may also be used. The organic packaging film layer 118b is formed by an inkjet printing process, but it is not limited to this, and a spraying process or the like may also be used.

Some embodiments of the present disclosure provide an electronic device including the touch panel described in the above embodiments. The electronic device may be a product or component with touch and display functions, such as an electronic watch, a vehicle display device, and the like.

The above descriptions are only preferred embodiments of the present disclosure and explanations of the technical principles applied. Those skilled in the art should understand that the scope of the invention involved in the present disclosure is not limited to the technical solutions formed by the specific combination of the above technical features, and should also cover other technical solutions formed by any combination of the above technical features or their equivalent features without departing from the inventive concept, for example, the technical features formed by mutual replacements of the above-mentioned features and the technical features with similar functions disclosed in the present disclosure (but not limited thereto).

What is claimed is:

1. A touch panel, comprising:
a substrate;
a plurality of first touch electrodes arranged on the substrate and extending in a first direction, wherein at least one first touch electrode comprises a plurality of first sub-electrodes electrically connected to one another and a plurality of first connecting sub-portions located between and electrically connecting every two adjacent first sub-electrodes; and
a plurality of second touch electrodes arranged on the substrate and extending in a second direction intersecting the first direction, wherein at least one second touch electrode comprises a plurality of second sub-electrodes electrically connected to one another and a plurality of second connecting sub-portions located between and electrically connecting every two adjacent second sub-electrodes,
wherein at least one first connecting sub-portion at least partially overlaps at least one second connecting sub-portion so as to form a stacked structure as a connecting portion, the touch panel comprises a plurality of connecting portions, and the first touch electrode and the second touch electrode are electrically insulated from one another;
wherein the touch panel comprises an opening area, the plurality of connecting portions comprise at least one adjacent connecting portion adjacent to the opening area, and the adjacent connecting portion comprises a first adjacent connecting sub-portion and a second adjacent connecting sub-portion;
wherein the first adjacent connecting sub-portion electrically connects a first adjacent sub-electrode adjacent to the opening area and a first sub-electrode adjacent to the first adjacent sub-electrode;
wherein the second adjacent connecting sub-portion electrically connects a second adjacent sub-electrode adjacent to the opening area and a second sub-electrode adjacent to the second adjacent sub-electrode;

wherein at least one first touch electrode comprises the first adjacent connecting sub-portion and some other first connecting sub-portions;

wherein at least one second touch electrode comprises the second adjacent connecting sub-portion and some other second connecting sub-portions;

wherein in the at least one first touch electrode, a first straight line connecting centers of orthographic projections of at least two connecting portions of a plurality of connecting portions formed by the some other first connecting sub-portions on the substrate extends in the first direction;

wherein in the at least one second touch electrode, a second straight line connecting centers of orthographic projections of at least two connecting portions of the plurality of connecting portions formed by the some other second connecting sub-portions on the substrate extends in the second direction; and wherein the first straight line and the second straight line intersect at a first intersection point, and a center of an orthographic projection of the adjacent connecting portion on the substrate does not overlap the first intersection point and is located outside the opening area.

2. The touch panel of claim 1, wherein the connecting portion comprises a first connecting portion, a second connecting portion, a third connecting portion and a fourth connecting portion, at least one of the first connecting portion, the second connecting portion, the third connecting portion or the fourth connecting portion is the adjacent connecting portion, and the opening area is surrounded by the first connecting portion, the second connecting portion, the third connecting portion and the fourth connecting portion; and wherein the first connecting portion and the second connecting portion are adjacent in the first direction and are electrically connected to a same first sub-electrode, the third connecting portion and the fourth connecting portion are adjacent in the first direction and are electrically connected to a same first sub-electrode, the first connecting portion and the third connecting portion are adjacent in the second direction and are electrically connected to a same second sub-electrode, and the second connecting portion and the fourth connecting portion are adjacent in the second direction and are electrically connected to a same second sub-electrode.

3. The touch panel of claim 2, wherein the first intersection point comprises a first connecting portion intersection point corresponding to the first connecting portion, a second connecting portion intersection point corresponding to the second connecting portion, a third connecting portion intersection point corresponding to the third connecting portion, and a fourth connecting portion intersection point corresponding to the fourth connecting portion; a center of an orthographic projection of the first connecting portion on the substrate overlaps the first connecting portion intersection point, a center of an orthographic projection of the second connecting portion on the substrate does not overlap the second connecting portion intersection point, a center of an orthographic projection of the third connecting portion on the substrate overlaps the third connecting portion intersection point, and a center of an orthographic projection of the fourth connecting portion on the substrate overlaps the fourth connecting portion intersection point.

4. The touch panel of claim 3, wherein at least two of the group consisting of a distance from a center of the opening area to the center of the orthographic projection of the first connecting portion on the substrate, a distance from the center of the opening area to the center of the orthographic projection of the second connecting portion on the substrate, a distance from the center of the opening area to the center of the orthographic projection of the third connecting portion on the substrate, and a distance from the center of the opening area to the center of the orthographic projection of the fourth connecting portion on the substrate, are different from one another.

5. The touch panel of claim 3, wherein at least one connecting portion of the first connecting portion, the second connecting portion, the third connecting portion and the fourth connecting portion is located between and electrically connected to a $1^{st}$ first sub-electrode and a $2^{nd}$ first sub-electrode that are adjacent in the first direction, the $1^{st}$ first sub-electrode is closer to the opening area than the $2^{nd}$ first sub-electrode; the touch panel further comprises a $3^{rd}$ first sub-electrode on a side of the $2^{nd}$ first sub-electrode away from the $1^{st}$ first sub-electrode, the $3^{rd}$ first sub-electrode is adjacent to and electrically connected to the $2^{nd}$ first sub-electrode through a fifth connecting portion; and wherein the at least one connecting portion is located between and electrically connected to a $1^{st}$ second sub-electrode and a $2^{nd}$ second sub-electrode that are adjacent in the second direction, the $1^{st}$ second sub-electrode is closer to the opening area than the $2^{nd}$ second sub-electrode; the touch panel further comprises a $3^{rd}$ second sub-electrode on a side of the $2^{nd}$ second sub-electrode away from the $1^{st}$ second sub-electrode, the $3^{rd}$ second sub-electrode is adjacent to and electrically connected to the $2^{nd}$ second sub-electrode through a sixth connecting portion.

6. The touch panel of claim 5, wherein the $1^{st}$ first sub-electrode has an area not less than 50% of an area of the $3^{rd}$ first sub-electrode, and the $2^{nd}$ first sub-electrode has an area not less than 70% of the area of the $3^{rd}$ first sub-electrode; and/or the 1st second sub-electrode has an area not less than 50% of an area of the 3rd second sub-electrode, and the 2nd second sub-electrode has an area not less than 70% of the area of the 3rd second sub-electrode.

7. The touch panel of claim 5, further comprising:

an effective touch area surrounding the opening area, wherein the $1^{st}$ first sub-electrode and the $1^{st}$ second sub-electrode are located in the effective touch area; and a wiring area located between the effective touch area and the opening area, wherein an anti-cracking ring is provided in the wiring area, the anti-cracking ring surrounds the opening area and is formed as a ring with at least one first opening, and the anti-cracking ring is disconnected at the at least one first opening; and wherein an anti-static ring is further provided in the wiring area, the anti-static ring surrounds the anti-cracking ring and is formed as a ring with at least one second opening corresponding to the at least one first opening, and the anti-static ring is disconnected at the at least one second opening.

8. The touch panel of claim 7, wherein a connecting ring is provided at a boundary between the wiring area and the effective touch area, the connecting ring surrounds the anti-static ring; the connecting ring comprises a first connecting sub-ring and a second connecting sub-ring that are disconnected at a boundary of the $1^{st}$ first sub-electrode and the $1^{st}$ second sub-electrode, the first connecting sub-ring is electrically connected to the $1^{st}$ first sub-electrode, and the second connecting sub-ring is electrically connected to the $1^{st}$ second sub-electrode.

9. The touch panel of claim 8, wherein the first connecting sub-ring is located on a side of the $1^{st}$ first sub-electrode away from the substrate and is in direct electrical contact with the $1^{st}$ first sub-electrode, and an orthographic projection of the first connecting sub-ring on the substrate falls within an orthographic projection of the $1^{st}$ first sub-electrode on the substrate; and/or
   wherein the second connecting sub-ring is located on a side of the 1st second sub-electrode away from the substrate and is in direct electrical contact with the 1st second sub-electrode, and an orthographic projection of the second connecting sub-ring on the substrate falls within an orthographic projection of the 1st second sub-electrode on the substrate.

10. The touch panel of claim 8, wherein at least one of the anti-cracking ring or the anti-static ring comprises a first sub-layer and a second sub-layer that are arranged sequentially away from the substrate, the first sub-layer is arranged in the same layer as the 1st first sub-electrode and the $1^{st}$ second sub-electrode, and the second sub-layer is arranged in the same layer as the connecting ring.

11. The touch panel of claim 1, wherein:
   the touch panel further comprises a curved edge and at least one first sub-electrode or second sub-electrode adjacent to the curved edge, wherein the plurality of connecting portions further comprise a seventh connecting portion electrically connected to the at least one first sub-electrode or second sub-electrode adjacent to the curved edge; a fifth straight line connecting centers of orthographic projections of at least two of some other connecting portions of the first touch electrode where the seventh connecting portion is located on the substrate extends in the first direction, a sixth straight line connecting centers of orthographic projections of at least two of some other connecting portions of the second touch electrode where the seventh connecting portion is located on the substrate extends in the second direction; the fifth straight line and the sixth straight line intersect at a third intersection point, and a center of an orthographic projection of the seventh connecting portion on the substrate is located on a side of the third intersection point away from the curved edge; or
   at least one first sub-electrode adjacent to and electrically connected to at least one connecting portion is arranged adjacent to at least one second sub-electrode adjacent to and electrically connected to the at least one connecting portion, and a boundary between the first sub-electrode and the second sub-electrode is formed as a polygonal line.

12. The touch panel of claim 1, wherein at least one connecting portion comprises:
   a first connecting sub-portion extending in the first direction and electrically connecting the $1^{st}$ first sub-electrode and the $2^{nd}$ first sub-electrode that are adjacent in the first direction; and
   a second connecting sub-portion extending in the second direction and electrically connecting the $1^{st}$ second sub-electrode and the $2^{nd}$ second sub-electrode that are adjacent in the second direction;
   wherein one of the first connecting sub-portion or the second connecting sub-portion as well as the 1st first sub-electrode, the 2nd first sub-electrode, the 1st second sub-electrode and the 2nd second sub-electrode are located in a first electrode layer; the other of the first connecting sub-portion or the second connecting sub-portion is located in a second electrode layer; and a first insulating layer is provided between the first electrode layer and the second electrode layer.

13. The touch panel of claim 12, wherein a structure of the first connecting sub-portion located in the second electrode layer is electrically connected to the $1^{st}$ first sub-electrode and the $2^{nd}$ first sub-electrode through a via hole penetrating the first insulating layer; and a structure of the second connecting sub-portion located in the second electrode layer is in direct contact with the $1^{st}$ second sub-electrode and the $2^{nd}$ second sub-electrode; or
   wherein a structure of the first connecting sub-portion located in the second electrode layer is in direct contact with the $1^{st}$ first sub-electrode and the 2nd first sub-electrode; and a structure of the second connecting sub-portion located in the second electrode layer is electrically connected to the 1st second sub-electrode and the 2nd second sub-electrode through a via hole penetrating the first insulating layer.

14. The touch panel of claim 12, wherein the first connecting sub-portion comprises:
   an intermediate connecting electrode surrounded by the $1^{st}$ first sub-electrode, the $2^{nd}$ first sub-electrode, the $1^{st}$ second sub-electrode and the $2^{nd}$ second sub-electrode;
   a first bridge electrode for electrically connecting the $1^{st}$ first sub-electrode and the intermediate connecting electrode; and
   a second bridge electrode for electrically connecting the $2^{nd}$ first sub-electrode and the intermediate connecting electrode,
   and wherein the second connecting sub-portion comprises:
     an annular connecting electrode surrounding the intermediate connecting electrode and surrounded by the $1^{st}$ first sub-electrode, the $2^{nd}$ first sub-electrode, the $1^{st}$ second sub-electrode and the $2^{nd}$ second sub-electrode;
     a third bridge electrode for electrically connecting the $1^{st}$ second sub-electrode and the annular connecting electrode; and
     a fourth bridge electrode for electrically connecting the $2^{nd}$ second sub-electrode and the annular connecting electrode.

15. The touch panel of claim 14, wherein the intermediate connecting electrode, the annular connecting electrode, the $1^{st}$ first sub-electrode, the $2^{nd}$ first sub-electrode, the $1^{st}$ second sub-electrode and the $2^{nd}$ second sub-electrode are made of the same material and arranged in the same layer; and
   wherein the first bridge electrode, the second bridge electrode, the third bridge electrode and the fourth bridge electrode are made of the same material and arranged in the same layer.

16. The touch panel of claim 14, wherein the first bridge electrode comprises a $1^{st}$ first bridge electrode and a $2^{nd}$ first bridge electrode that converge from the $1^{st}$ first sub-electrode toward the intermediate connecting electrode;
   wherein the second bridge electrode comprises a $1^{st}$ second bridge electrode and a $2^{nd}$ second bridge electrode that converge from the $2^{nd}$ first sub-electrode toward the intermediate connecting electrode;
   wherein the third bridge electrode comprises a $1^{st}$ third bridge electrode and a $2^{nd}$ third bridge electrode that converge from the $1^{st}$ second sub-electrode toward the intermediate connecting electrode; and wherein the fourth bridge electrode comprises a $1^{st}$ fourth bridge electrode and a $2^{nd}$ fourth bridge electrode that converge from the $2^{nd}$ second sub-electrode toward the intermediate connecting electrode.

17. The touch panel of claim 16, wherein an edge of the intermediate connecting electrode comprises a first polygonal line segment, a second polygonal line segment, a third polygonal line segment, a fourth polygonal line segment, a fifth polygonal line segment, a sixth polygonal line segment, a seventh polygonal line segment and an eighth polygonal line segment that are connected end to end in sequence;

wherein the first polygonal line segment and the fifth polygonal line segment extend in a fifth direction, the second polygonal line segment and the sixth polygonal line segment extend in a sixth direction, the third polygonal line segment and the seventh polygonal line segment extend in a seventh direction, and the fourth polygonal line segment and the eighth polygonal line segment extend in an eighth direction; and wherein each of the fifth direction, the sixth direction, the seventh direction and the eighth direction intersects each of the first direction and the second direction, and any two of the fifth direction, the sixth direction, the seventh direction and the eighth direction intersect one another;

wherein an edge of the annular connecting electrode away from the intermediate connecting electrode comprises a first polygonal line portion, a second polygonal line portion, a third polygonal line portion, a fourth polygonal line portion, a fifth polygonal line portion, a sixth polygonal line portion, a seventh polygonal line portion and an eighth polygonal line portion that are connected end to end in sequence; and wherein the first polygonal line portion, the second polygonal line portion, the third polygonal line portion, the fourth polygonal line portion, the fifth polygonal line portion, the sixth polygonal line portion, the seventh polygonal line portion and the eighth polygonal line portion of the annular connecting electrode are arranged parallel to the first polygonal line segment, the second polygonal line segment, the third polygonal line segment, the fourth polygonal line segment, the fifth polygonal line segment, the sixth polygonal line segment, the seventh polygonal line segment and the eighth polygonal line segment of the intermediate connecting electrode, respectively.

18. The touch panel of claim 17, wherein the $1^{st}$ first bridge electrode extends across the first polygonal line segment and the first polygonal line portion to electrically connect the $1^{st}$ first sub-electrode and the intermediate connecting electrode;

wherein the $2^{nd}$ first bridge electrode extends across the second polygonal line segment and the second polygonal line portion to electrically connect the $1^{st}$ first sub-electrode and the intermediate connecting electrode;

wherein the $1^{st}$ second bridge electrode extends across the sixth polygonal line segment and the sixth polygonal line portion to electrically connect the $2^{nd}$ first sub-electrode and the intermediate connecting electrode;

wherein the $2^{nd}$ second bridge electrode extends across the fifth polygonal line segment and the fifth polygonal line portion to electrically connect the $2^{nd}$ first sub-electrode and the intermediate connecting electrode;

wherein the $1^{st}$ third bridge electrode extends across the eighth polygonal line portion to electrically connect the $1^{st}$ second sub-electrode and the annular connecting electrode;

wherein the $2^{nd}$ third bridge electrode extends across the seventh polygonal line portion to electrically connect the $1^{st}$ second sub-electrode and the annular connecting electrode;

wherein the $1^{st}$ fourth bridge electrode extends across the third polygonal line portion to electrically connect the $2^{nd}$ second sub-electrode and the annular connecting electrode; and wherein the $2^{nd}$ fourth bridge electrode extends across the fourth polygonal line portion to electrically connect the $2^{nd}$ second sub-electrode and the annular connecting electrode.

19. A touch display panel, comprising:
a display panel; and
the touch panel of claim 1.

20. An electronic device, comprising the touch panel of claim 1.

* * * * *